(12) United States Patent
Kozlov et al.

(10) Patent No.: US 11,563,442 B2
(45) Date of Patent: Jan. 24, 2023

(54) CALIBRATION OF CONTINUOUS-TIME RESIDUE GENERATION SYSTEMS FOR ANALOG-TO-DIGITAL CONVERTERS

(71) Applicant: Analog Devices International Unlimited Company, Limerick (IE)

(72) Inventors: Victor Kozlov, Toronto (CA); Sharvil Pradeep Patil, Toronto (CA); Hajime Shibata, Toronto (CA)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 17/389,428

(22) Filed: Jul. 30, 2021

(65) Prior Publication Data
US 2022/0045687 A1    Feb. 10, 2022

Related U.S. Application Data

(60) Provisional application No. 63/062,819, filed on Aug. 7, 2020.

(51) Int. Cl.
H03M 1/10    (2006.01)
H03M 1/06    (2006.01)

(52) U.S. Cl.
CPC ....... *H03M 1/1028* (2013.01); *H03M 1/0626* (2013.01)

(58) Field of Classification Search
CPC .... H03M 1/001; H03M 1/1009; H03M 1/164; H03M 1/145; H03M 3/414; H03M 1/06;
(Continued)

(56) References Cited

U.S. PATENT DOCUMENTS 6,331,830 B1 *  12/2001  Song ................... H03M 1/1057
                                                341/120
6,489,904 B1 *  12/2002  Hisano ................ H03M 1/1061
                                                341/161
(Continued)

OTHER PUBLICATIONS

Shen et al., *A Two-Step ADC with a Continuous-Time SAR-Based First Stage*, IEEE Journal of Solid-State Circuits, vol. 54, No. 12, Dec. 2019, 11 pages.
(Continued)

*Primary Examiner* — Linh V Nguyen
(74) *Attorney, Agent, or Firm* — Akona IP PC

(57) ABSTRACT

Calibration of continuous-time (CT) residue generation systems can account and compensate for mismatches in magnitude and phase that may be caused by fabrication processes, temperature, and voltage variations. In particular, calibration may be performed by providing one or more known test signals as an input to a CT residue generation system, analyzing the output of the system corresponding to the known input, and then adjusting one or more parameters of a forward and/or a feedforward path of the system so that the difference in transfer functions of these paths may be reduced/minimized. Calibrating CT residue generation systems using test signals may help decrease the magnitude of the residue signals generated by such systems, and, consequently, advantageously increase an error correction range of such systems or of further stages that may use the residue signals as input.

20 Claims, 15 Drawing Sheets

(58) Field of Classification Search
CPC ............ H03M 1/0626; H03M 1/0854; H03M 1/1004; H03M 1/1023; H03M 1/1042; H03M 1/109; H03M 1/1295; H03M 1/14; H03M 1/069; H03M 1/141; H03M 1/168; H03M 1/188; H03M 1/361; H03M 1/38; H03M 3/38; H03M 3/412; H03M 3/46; H03M 3/464
USPC ................. 341/155, 156, 161, 162, 118, 120
See application file for complete search history.

(56) References Cited

U.S. PATENT DOCUMENTS

| | | | |
|---|---|---|---|
| 6,518,838 B1* | 2/2003 | Risbo | H03F 3/2175 330/10 |
| 6,970,120 B1 | 11/2005 | Bjornsen | |
| 8,779,963 B1* | 7/2014 | Bales | H03M 1/007 341/161 |
| 8,896,475 B2 | 11/2014 | Shibata | |
| 9,219,490 B1* | 12/2015 | Pereira | H03M 1/007 |
| 9,312,840 B2* | 4/2016 | Dong | H03M 1/0626 |
| 9,432,045 B2 | 8/2016 | Shibata | |
| 9,595,974 B1* | 3/2017 | Pereira | H03M 1/164 |
| 9,768,793 B2* | 9/2017 | Meng | H03M 1/124 |
| 9,774,344 B2 | 9/2017 | Shibata | |
| 10,171,102 B1 | 1/2019 | Shibata et al. | |
| 10,181,860 B1 | 1/2019 | Patil et al. | |
| 2001/0040962 A1* | 11/2001 | Pratt | H04M 3/301 379/398 |
| 2004/0075599 A1* | 4/2004 | Jonsson | H03M 1/108 341/120 |
| 2005/0114428 A1* | 5/2005 | Mukherjee | H03F 3/45183 708/819 |
| 2005/0275578 A1* | 12/2005 | Bjornsen | H03M 1/0641 341/155 |
| 2008/0238754 A1 | 10/2008 | Knudsen | |
| 2008/0258949 A1* | 10/2008 | Galton | H03M 1/1004 341/120 |
| 2014/0104086 A1* | 4/2014 | Zhang | H03M 1/1023 341/120 |
| 2015/0138006 A1* | 5/2015 | Straeussnigg | H03M 1/164 341/155 |
| 2017/0041013 A1* | 2/2017 | Nagarajan | H03M 1/0641 |
| 2017/0317860 A1* | 11/2017 | Bolatkale | H04B 1/109 |

OTHER PUBLICATIONS

Gubbins et al., *A Continuous-time Input Pipeline ADC*, IEEE 2008 Custom Integrated Circuits Conference (CICC), 4 pages.

Gubbins et al., *A Continuous-Time Input Pipeline ADC with Inherent Anti-Alias Filtering*, IEEE 2009 Custom Integrated Circuits Conference (CICC), 4 pages.

O'Hare et al., *Bandwidth Enhancement to Continuous-Time Input Pipeline ADCs*, IEEE Transactions on Very Large Scale Integration (VLSI) Systems, vol. 26, No. 2, Feb. 2018, 12 pages.

Caldwell et al., *High-Speed Oversampled Continuous-Time Analog-to-Digital Converters*, 978-1-5090-6389-5 © 2017, 4 pages.

Shibata et al., *A 9GS/s 1GHz-BW Oversampled Continuous-Time Pipeline ADC Achieving—161dBFS/Hz NSD*, ISSCC 2017, Session 16, Gigahertz Data Converters, 16.2, 3 pages.

Gubbins et al., *Continuous-Time Input Pipeline ADCs*, IEEE Journal of Solid-State Circuits, vol. 45, No. 8, Aug. 2010, 13 pages.

* cited by examiner

US 11,563,442 B2

CALIBRATION OF CONTINUOUS-TIME RESIDUE GENERATION SYSTEMS FOR ANALOG-TO-DIGITAL CONVERTERS

PRIORITY DATA

This application claims priority to and/or receives benefit from U.S. Provisional Application No. 63/062,819, titled "CALIBRATION OF CONTINUOUS-TIME RESIDUE GENERATION SYSTEMS FOR ANALOG-TO-DIGITAL CONVERTERS", filed on 7 Aug. 2020. The US Provisional Application is incorporated herein in its entirety.

TECHNICAL FIELD OF THE DISCLOSURE

The disclosure relates generally to analog-to-digital converters (ADCs) and, more particularly, to ADCs that employ continuous-time (CT) residue generation.

BACKGROUND

Real-world analog signals such as temperature, pressure, sound, or light are routinely converted to a digital representation that can be easily processed in modern digital signal processing systems. The circuits that perform this conversion of an analog input signal to a digital output signal are referred to as "ADCs." ADCs can translate analog electrical signals representing real-world phenomena such as temperature, pressure, sound, or light to digital signals for data processing purposes.

ADCs can be found in many places such as broadband communication systems, audio systems, receiver systems, etc., and are used in a broad range of applications including communications, energy, healthcare, instrumentation and measurement, motor and power control, industrial automation and aerospace/defense. For example, in precision measurement systems, electronics may be provided with one or more sensors to make measurements, and these sensors may generate an analog signal. The analog signal would then be provided to an ADC as an input to generate a digital output signal for further processing. In another example, an antenna may generate an analog signal based on the electromagnetic waves carrying information/signals in the air. The analog signal generated by the antenna is then provided as an input to a signal chain having an ADC to generate a digital output signal for further processing.

Designing an ADC is a non-trivial task because each application may have different needs in speed, performance, power, cost, and size. As the applications needing ADCs grow, the need for accurate and reliable conversion performance also grows.

BRIEF DESCRIPTION OF THE DRAWINGS

To provide a more complete understanding of the disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

CT residue generation systems/stages (referred to herein as "systems") are increasingly popular in high-performance and high-speed ADCs, partly due to their inherent anti-aliasing and their potential to achieve high sampling rates. However, the magnitude of the residue signal may depend on the matching between components of the residue generation system, i.e., transfer functions of parallel forward and feedforward circuit paths. If the mismatch is not addressed, the residue signal may exceed the error correction range of such system or of further stages that may use the residue signal as the input.

Calibration of CT residue generation systems can account and compensate for mismatches in magnitude and phase that may be caused by fabrication processes, temperature, and voltage variations. In particular, calibration may be performed by providing one or more known test signals as an input to a CT residue generation system, analyzing the output of the system corresponding to the known input, and then adjusting one or more parameters of a forward and/or a feedforward path of the system so that the difference in transfer functions of these paths may be reduced/minimized. Calibrating CT residue generation systems using test signals may help decrease the magnitude of the residue signals generated by such systems, and, consequently, advantageously allow for the error correction range of such systems or of further stages that may use the residue signals as input to be budgeted for other errors.

Challenges of ADCs Using CT Residue Generation Systems

ADCs are electronic devices that convert a continuous physical quantity carried by an analog signal to a digital number that represents the quantity's amplitude (or to a digital signal carrying that digital number). The conversion involves quantization of the analog input signal, i.e. a process of mapping input values from a continuous set of analog values to output values in a countable smaller set of digital values, so it would introduce a small amount of error. The result is a sequence of digital values (i.e., a digital signal) that represents conversion of a CT and continuous-amplitude analog input signal to a discrete-time (DT) and discrete-amplitude digital signal.

An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal to noise ratio (SNR), signal-to-noise-and-distortion ratio (SI-NAD), effective number of bits (ENOB), total harmonic distortion (THD), total harmonic distortion plus noise (THD+N), and spurious free dynamic range (SFDR). ADCs have many different designs, which can be chosen based on the application requirements and performance specifications.

Figure 1:
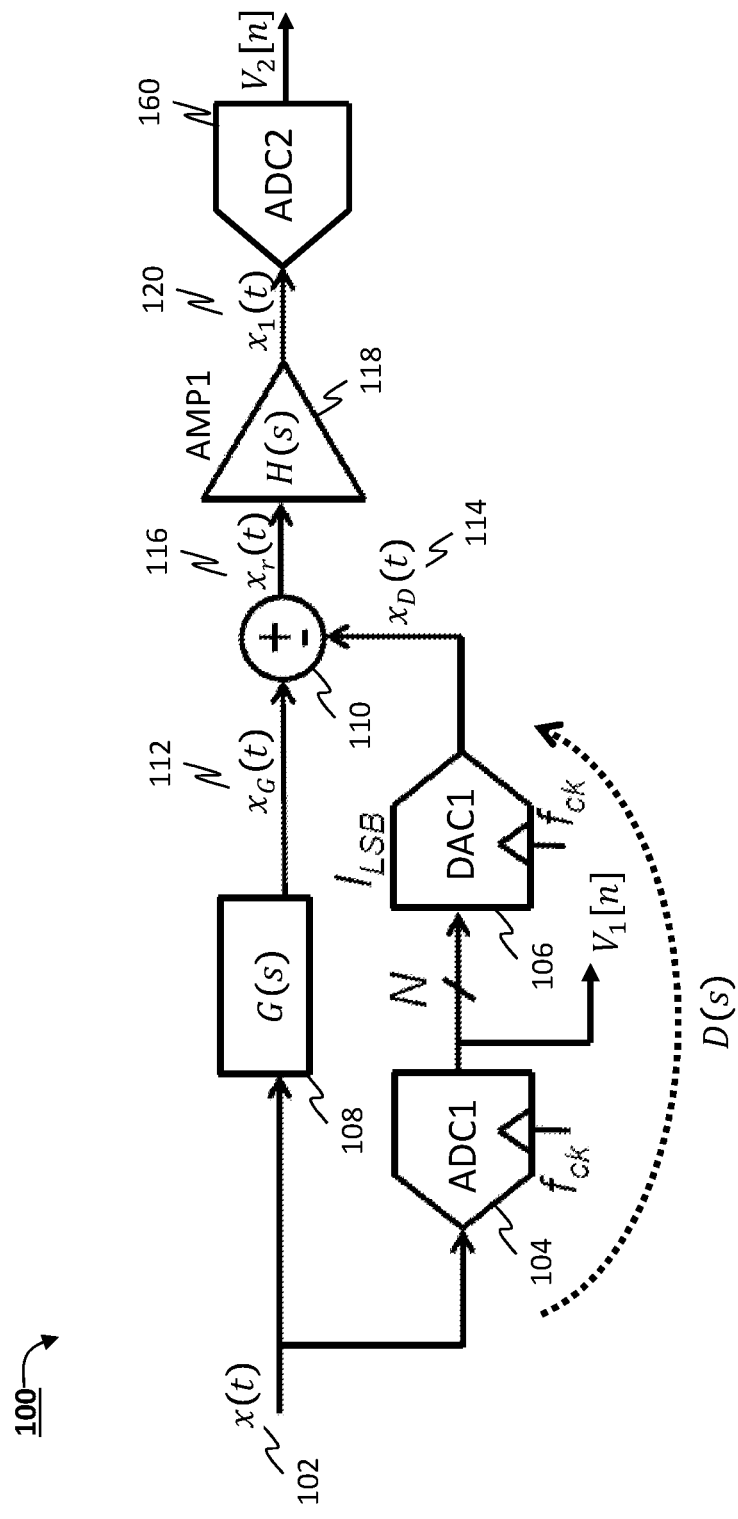
FIG. 1 provides an illustrative system diagram of a system comprising a conventional CT residue generation system followed by a backend ADC2, according to some embodiments of the disclosure.

ADCs based on CT residue generation systems are increasingly popular in high-performance and high-speed data converters, thanks to their inherent anti-aliasing and their potential to achieve high sampling rates. An example of a CT residue generation system 100 is shown in FIG. 1, according to some embodiments of the disclosure. As shown in FIG. 1, a CT analog input, x(t) 102 is provided to two parallel and different paths. A first path, which may be described as a "feedforward" path, includes a cascade of a quantizer (ADC1) 104 and a feedforward digital-to-analog converter (DAC) DAC1 106. A second path, which may be described as a "forward" path, includes a CT filter 108 having a transfer function G(s).

In the forward path, the CT filter 108 having analog transfer function G(s) is applied to the CT analog input x(t) 102 to generate an output signal $x_G(t)$ 112, a filtered or delayed version of CT analog input x(t) 102 The transfer function G(s) represents the frequency response of CT filter having CT circuit components. Typically, the CT filter 108 delays the CT analog input signal x(t) 102, and may have a transfer function G(s) that provides substantially constant group delay over a range of input frequencies of interest. For instance, the delay of the CT filter may match the inherent delay in the feedforward path. CT circuit components may include one or more of transmission lines, shunt capacitors, series resistors, shunt resistor-capacitor circuits, shunt inductor-capacitor circuits, resistor-capacitor (RC) lattice delay lines, and inductor-capacitor (LC) lattice delay lines.

In the feedforward path, the CT analog input x(t) 102 is processed by circuitry which can include an N-bit ADC implementing the quantizer (ADC1) 104 and an N-bit DAC implementing the feedforward DAC (DAC1) 106. There may be other circuitry which is not explicitly shown besides ADC1 104 and DAC1 106. For instance, the feedforward path can include an analog filter upstream of ADC1 104. The feedforward path can include a digital filter upstream of DAC1 106. The quantizer 104 and feedforward DAC 106 may be clocked at a sampling rate of $f_{ck}$ in the feedforward path. Quantizer 104 generates a digital output $V_1[n]$ and the digital output $V_1[n]$ is provided as input to feedforward DAC 106 to generate an analog output signal $x_D(t)$ 114 (sometimes referred to as the reconstructed input signal). A linearized model of the feedforward path can be characterized by a transfer function D(s), which relates the input signal components of the analog output signal $x_D(t)$ 114 to the feedforward path's analog input signal x(t) 102. The analog output signal $x_D(t)$ 114 is a reconstructed version of the CT analog input x(t) 102.

To generate a CT residue signal $x_r(t)$ 116, which represents a difference between the original CT analog input signal x(t) and the reconstructed input signal $x_D(t)$, a difference between the outputs of the forward path and the feedforward path is obtained. In some cases, a subtractor 110 subtracts the output signal $x_G(t)$ 112 of CT filter 108 from the output $x_D(t)$ 114 of the feedforward DAC 106 to generate a residue signal $x_r(t)$ 116. Subtractor 110 can be implemented as a summation node, if the inputs to the summation node has the appropriate polarity to allow for differencing to occur. Instead of providing $x_D(t)$, $-x_D(t)$ can be provided to a summation node such that $x_D(t)$ can be subtracted from $x_G(t)$.

Thus, the CT residue generation system 100 may generate a filtered CT residue signal $x_1(t)$ by amplifying and/or filtering residue signal $x_r(t)$. The amplifying and/or filtering can be performed by a band-selective residue amplifier, filter H(s) 118. The filter H(s) 118 operates on the difference of a time-delayed input signal x(t) (i.e., $x_G(t)$) and a reconstructed version or approximation of the input signal (i.e., $x_D(t)$), as processed by a coarse quantizer 104 and injected by the feedforward DAC 106.

The filtered residue signal $x_1(t)$ may then be quantized by a backend ADC 160, shown in FIG. 1 as "ADC2," to generate a digital output $V_2[n]$, as shown in FIG. 1. In various embodiments, the backend ADC (ADC2) 160 may be a CT pipeline ADC that may include further CT residue generation systems/stages, or any other type of ADC satisfying speed and performance requirements for the target application. Further, the output sequence of the CT residue generation system 100 can be computed from a combination of $V_2[n]$ and an output $V_1[n]$ of the quantizer 104, e.g., using an appropriate digital filter typically referred to as a "digital reconstruction filter" (DRF) (the DRF not shown in FIG. 1).

As the foregoing illustrates, the required backend error correction range of the CT residue generation system 100 depends on the matching accuracy between the transfer function G(s) of the forward path and the transfer function D(s) of the feedforward path. By design, the G(s) and D(s) transfer functions may be chosen to closely match within the ADC's bandwidth, defined by the passband frequencies of H(s), such that the magnitude of the composite frequency response H(jω)·(G(jω)−D(jω)) may be minimized over that frequency range. However, the achievable matching accuracy is often limited by practical implementation constraints of one or more of the quantizer 104, the feedforward DAC 106, and the CT filter 108. For example, the manufacturing process may cause systematic or random mismatch errors in one or more of the quantizer 104, the feedforward DAC 106, and the CT filter 108, resulting in deviations of their respective transfer functions from the design targets and, consequently, resulting in a mismatch of the transfer functions of the forward and the feedforward paths. Analogously, temperature and/or voltage variations during operation of the CT residue generation system 100 may cause such a mismatch. A mismatch of the transfer functions of the forward and the feedforward paths may degrade the feedforward cancelation due to the leakage of the input signal x(t). In particular, the mismatch may cause the residue signal $x_r(t)$ to increase, resulting in reduced error correction range available for other sources of error, such as the quantization error of the quantizer 104, signal images that may be created by the feedforward DAC 106, any offsets present in the CT residue generation system 100, or any applied dither signals. An insufficient error correction range may result in an ADC that includes the CT residue generation system 100 becoming saturated when a sufficiently large input is applied, resulting in degraded linearity and noise performance. To alleviate this problem, the gain of the residue filter H(s) may be reduced, but, unfortunately, this degrades other performance metrics of the ADC.

Using Calibration to Match the Transfer Functions of Forward and Feedforward Paths Embodiments of the disclosure include systems and methods for reducing or eliminating the mismatch between the transfer functions of the forward and the feedforward paths of a CT residue generation system in a way that may improve on at least some of the challenges described above. In particular, embodiments of the disclosure are based on the recognition that calibration may be performed to account and compensate for magnitude and/or phase mismatches in a CT residue generation system. In particular, calibration may be performed by providing one or more known test signals as an input to a CT residue generation system, analyzing the output of the system corresponding to the known input (i.e., the known test signals), and then adjusting one or more parameters of one or more of the quantizer 104, the feedforward DAC 106, and the CT filter 108 (i.e., adjusting one or more parameters of the forward and/or the feedforward path of the system in the analog domain) so that the difference or mismatch in transfer functions G(s) and D(s) may be reduced/minimized. In some embodiments, calibration using known test signals as described herein may be performed to only compensate for magnitude variations. In other embodiments, calibration using known test signals as described herein may be performed to only compensate for phase variations. In still other embodiments, calibration using known test signals as described herein may be performed to compensate for both magnitude and phase variations.

Figure 2:
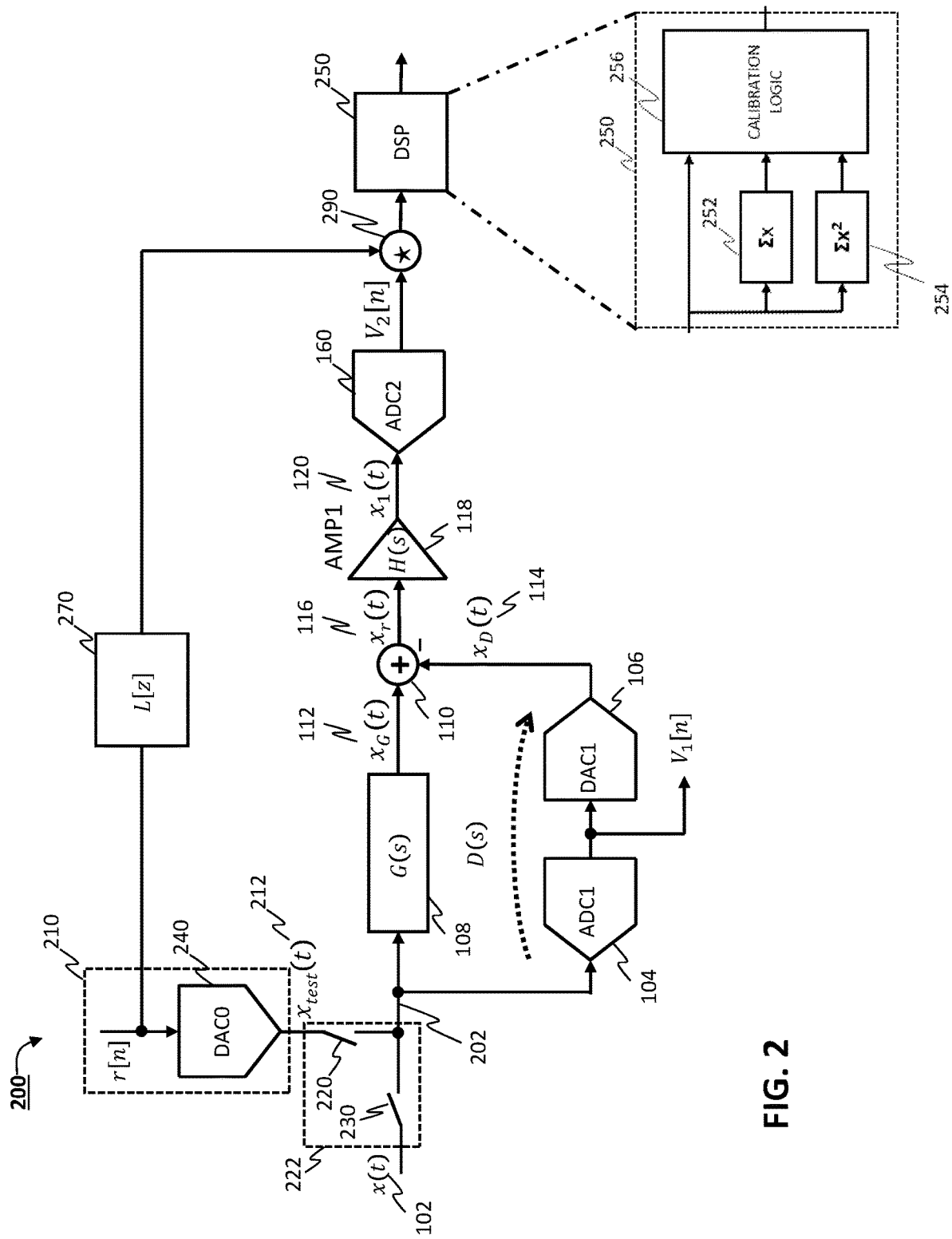
FIG. 2 provides an illustrative system diagram of a CT residue generation system to be calibrated using a test signal, according to some embodiments of the disclosure.

FIG. 2 provides a schematic illustration of a CT residue generation system 200 configured to be calibrated using a test signal, according to some embodiments of the disclosure. FIG. 2, as well as other figures, illustrates some of the same elements as those shown in FIG. 1 (e.g., the input signal x(t), the quantizer 104, the feedforward DAC 106, the CT filter 108, etc.) to illustrate the same, similar, or functionally analogous elements.

As shown in FIG. 2, the CT residue generation system 200 includes a calibration circuit 210 configured to provide a test signal $x_{test}(t)$ 212, which may be an analog signal, to be provided to the forward and the feedforward paths of the CT residue generation system 200 to be used for calibration. In some embodiments, the calibration circuit 210 may include a DAC, shown in FIG. 2 as DAC0 240, configured to receive a digital test signal r[n] and to convert the digital test signal r[n] to analog, thus generating the test signal $x_{test}(t)$ 212. In some embodiments, the digital test signal r[n] may be a pseudo-random sequence, resulting in a pseudo-random analog test signal $x_{test}(t)$. The pseudo-random analog test signal $x_{test}(t)$ may have a specific frequency spectrum shape across a frequency range of interest (e.g., the passband frequencies of H(s) corresponding to the filter 118).

In some embodiments, the pseudo-random analog test signal $x_{test}(t)$ may be a spectrally white signal across a bandwidth of the CT residue generation system (having the forward and feedforward paths). In some embodiments, the pseudo-random analog test signal $x_{test}(t)$ may be a spectrally white signal across a passband of the (interstage gain) filter 118.

FIG. 2 further illustrates a correlation unit (xcorr) 290 and a digital signal processing (DSP) unit 250. DSP unit 250 can be implemented with digital circuitry and/or a microprocessor that can execute instructions to carry out the processing of signals. DSP unit 250 may include summation block, shown as Σx 252. The summation block can be used, e.g., for computing an average or a quantity that reflects an average of the xcorr 290 output (e.g., mean of the xcorr 290 output). DSP unit 250 can include a sum of squares block, shown as $\Sigma x^2$ 254. The sum of squares block can be used, e.g., for computing a power or quantity that reflects a power of the xcorr 290 output. DSP unit 250 may include calibration logic 256 that takes the computed quantities and apply appropriate correction to the analog circuitry to compensate for the mismatches in the forward and feedforward paths. In some cases, the calibration logic 256 applies an iterative algorithm, such as a least means square algorithm (e.g., gradient descent), to update or change the parameters of the analog circuitry to drive computed quantities smaller and smaller.

Figure 9:
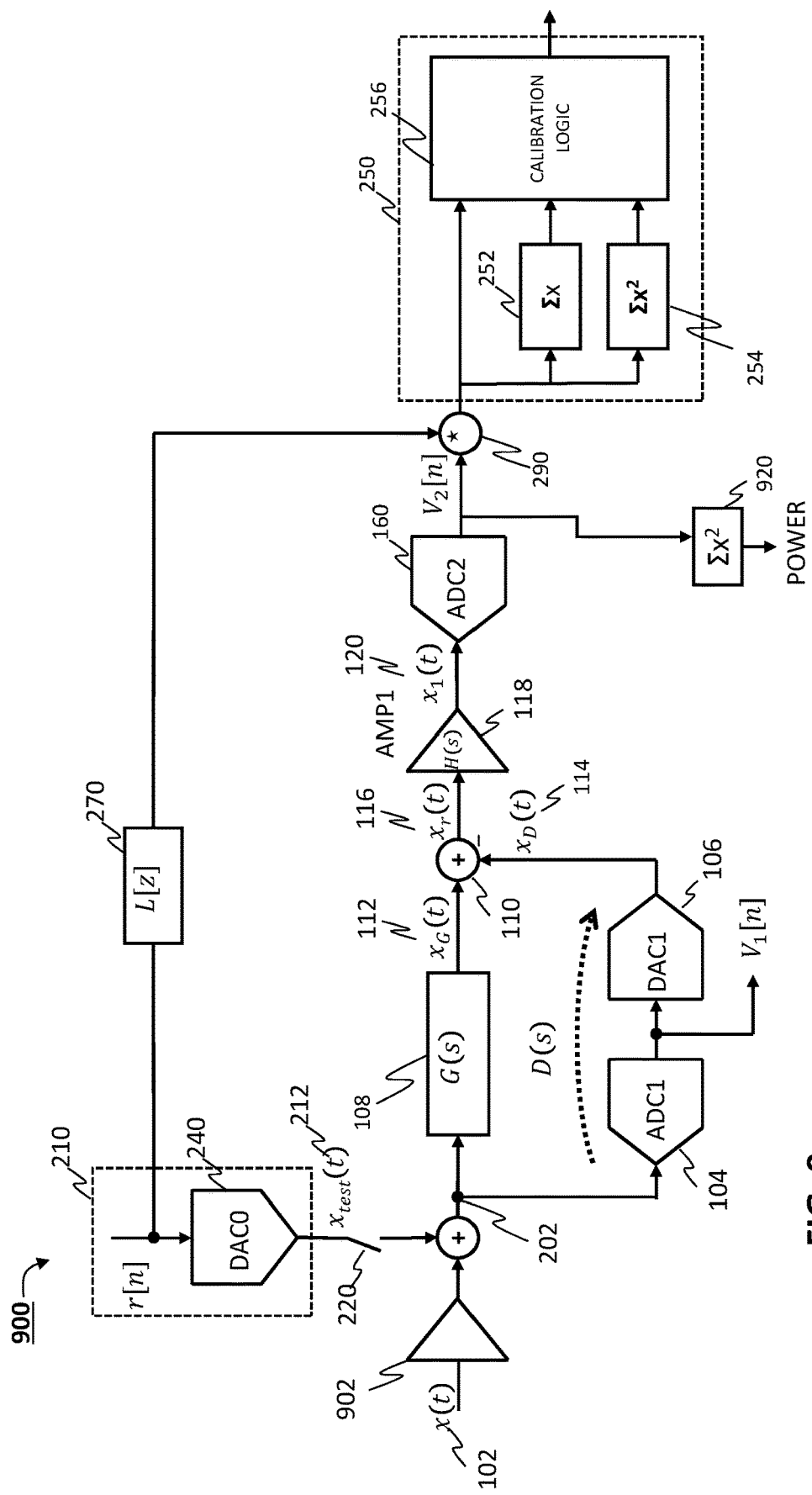
FIG. 9 provides an illustrative system diagram of a CT residue generation system having an input signal driver with programmable gain to receive or not receive an analog input x(t), according to some embodiments of the disclosure.
Figure 13:
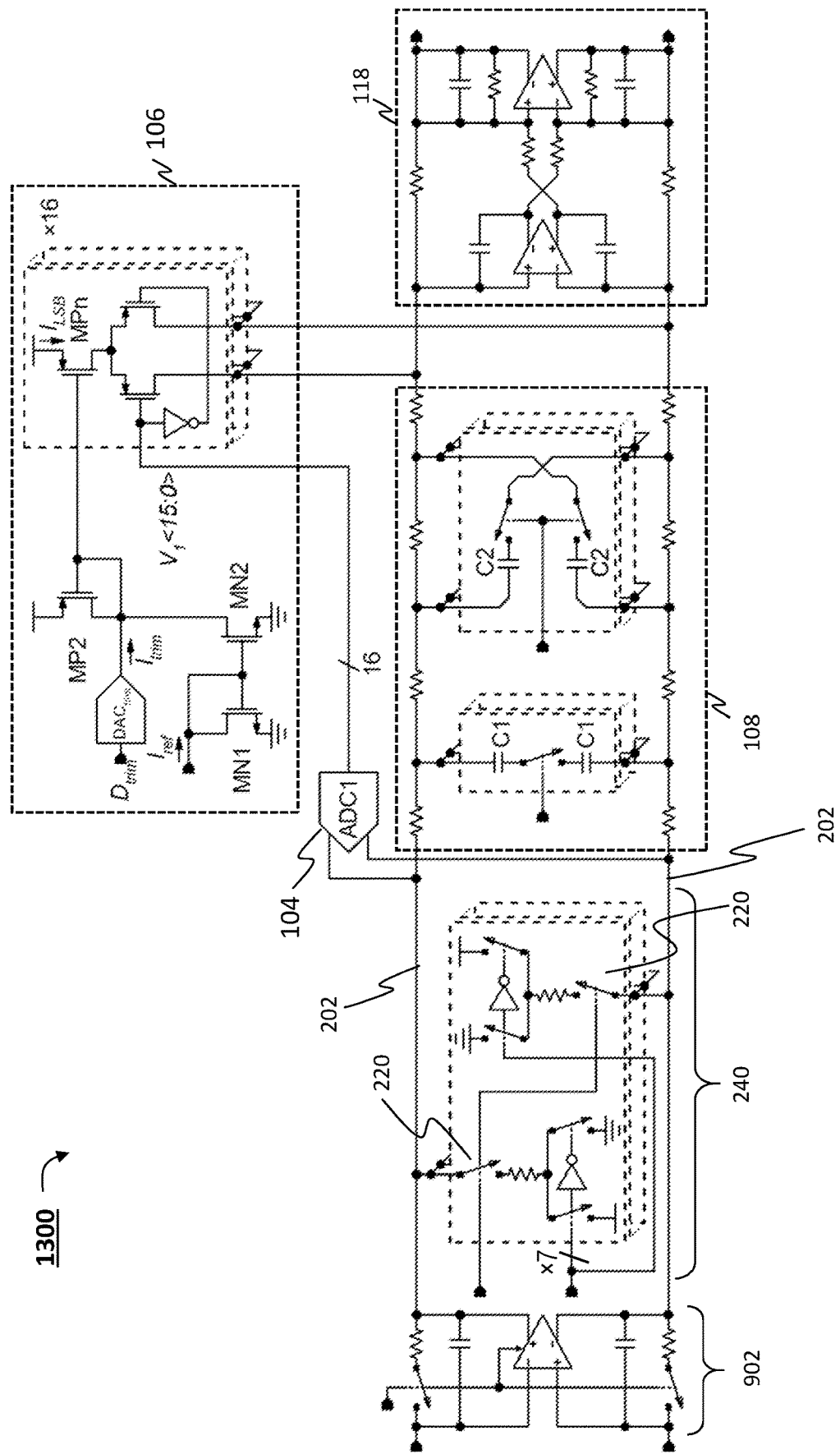
FIG. 13 provides a schematic illustration of a CT residue generation system according to some embodiments of the disclosure.

As further shown in FIG. 2, in some embodiments, the CT residue generation system 200 may include an analog multiplexer 222 (which, in some embodiments, may include a switch 230 and a switch 220), configured to provide one of the input signal x(t) or the test signal $x_{test}(t)$ to the forward and the feedforward paths of the CT residue generation system 200. In some embodiments, the CT residue generation system 200 may include a switch 230, configured to couple or decouple the input signal x(t) from node 202, node 202 being a common input to the parallel forward and feedforward paths. The functionality of decoupling the input signal from x(t) from node 202 can be implemented in different ways, some of which is illustrated in FIGS. 9 and 13. In some embodiments, in order to prevent degradation of performance of the CT residue generation system 200 when calibration is not being performed, the calibration circuit 210 (e.g., the DAC0 240) may be disabled such that its output is nulled. An alternative embodiment may disconnect the calibration circuit 210 e.g., disconnect the DAC0 240 output from the rest of the CT residue generation system 200 such as node 202, e.g., by providing a corresponding switch 220.

In some embodiments, the test signal $x_{test}(t)$ may be used to calibrate the CT residue generation system 200. In particular, the test signal $x_{test}(t)$ may be used to expose or measure the mismatches between G(s) and D(s). When the forward and feedforward paths are perfectly matched, the test signal $x_{test}(t)$ would be processed by the forward and feedforward paths in the same manner (e.g., experiencing the same magnitude and phase responses), and be canceled out completely at subtractor 110. In other words, $x_{test}(t)$ or components of $x_{test}(t)$ would not appear in CT residue signal $x_r(t)$ 116. If the forward and feedforward paths have mismatches, some component of $x_{test}(t)$ would appear in CT residue signal $x_r(t)$ 116, providing a hint that the paths have mismatches. The component of $x_{test}(t)$ appearing in CT residue signal $x_r(t)$ 116 (which is filtered by filter 118 and quantized by ADC2 160 to generate $V_2[n]$) would be correlated with r[n]. Based on the correlation, the difference between the G(s) and D(s) magnitude and/or phase responses can be reduced or minimized. In various embodiments, such calibration may be performed during the startup phase of the CT residue generation system 200, during a calibration phase of a CT residue generation system 200, and/or at some suitable points in time during operation of the CT residue generation system 200.

Figure 14:
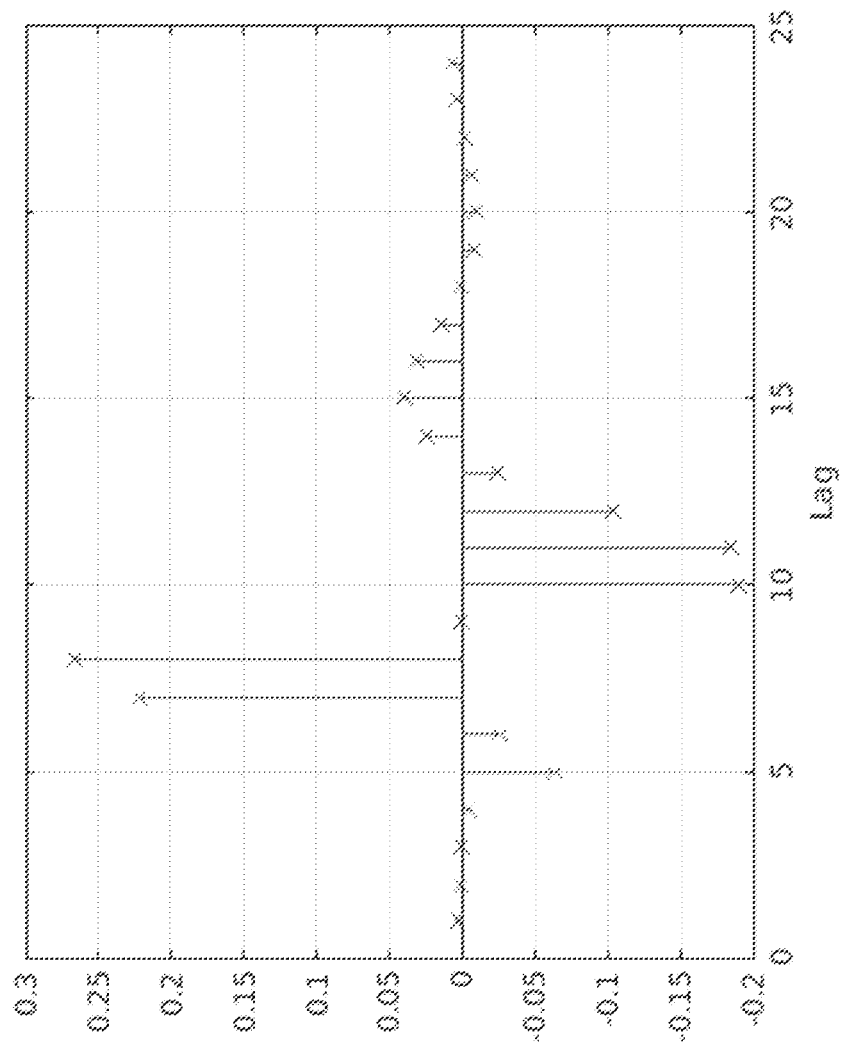
FIG. 14 shows exemplary cross-correlation results hinting that the forward and feedforward paths are mismatched, according to some embodiments of the disclosure.

In some embodiments, calibration of the CT residue generation system 200 using test signal $x_{test}(t)$ may be performed as follows. First, the analog input signal x(t) may be disconnected by, e.g., opening the switch 230. The pseudo-random sequence r[n] may then be injected into the CT residue generation system 200 by means of DAC0 240, thus providing the test signal $x_{test}(t)$ as the input test signal at node 202. In some embodiments, the amplitude of $x_{test}(t)$ may be sufficiently large so that it can span the input range of the CT residue generation system 200 but without overloading any of its internal states. In response to the test signal $x_{test}(t)$ is being provided, residue signal $x_r(t)$ 116 is generated by the forward and feedforward paths, and digitized output $V_2[n]$ is generated by ADC2 160. Cross-correlation of a sufficiently long record of the digitized output $V_2[n]$ (e.g., a finite-length sequence of values of the digitized output $V_2[n]$) with the corresponding stimulus test sequence r[n] may be performed using the correlator 290, possibly in combination with the DSP unit 250 (e.g., using any suitable digital circuitry, data processing device, or a data processing system, e.g., such as those described below), to measure residual content of the test signal in the amplified residue signal $x_1(t)$. Exemplary cross-correlation results from xcorr 290 is illustrated in FIG. 14.

A digital filter L[z] 270 may be applied to r[n] prior to cross-correlation to digitally correct for the effect of DAC0 240's frequency response.

Figure 11:
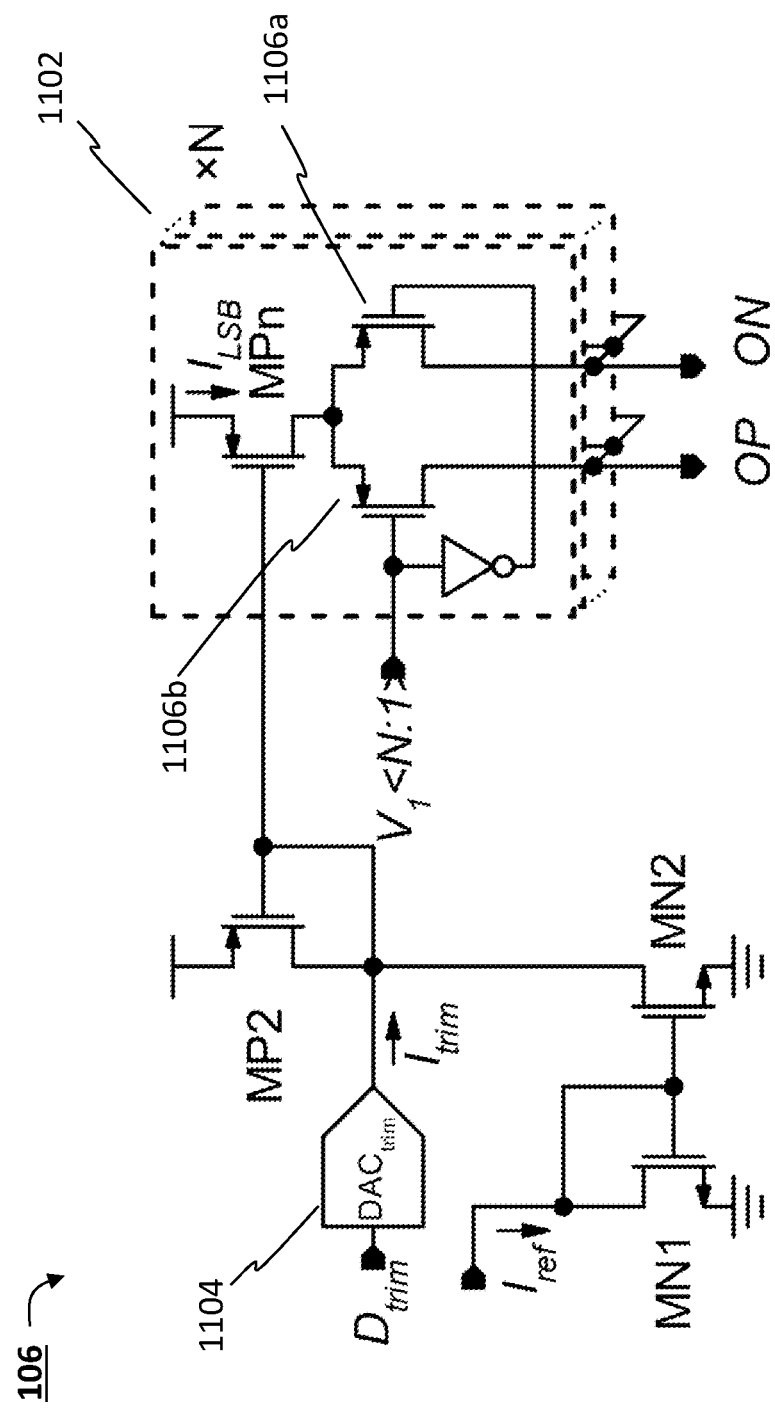
FIG. 11 provides a schematic illustration of a feedforward digital-to-analog converter with digitally trimmable current that may be used in a CT residue generation system to adjust the transfer function of the feedforward path, according to some embodiments of the disclosure.
Figure 12:
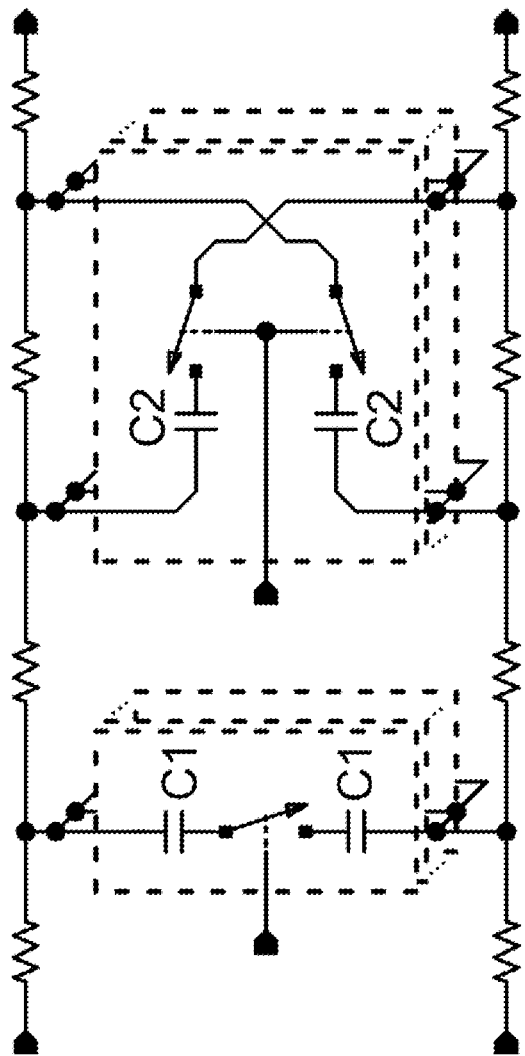
FIG. 12 provides a schematic illustration of a tunable CT filter that may be used in a CT residue generation system to adjust the transfer function of the forward path, according to some embodiments of the disclosure.

In some embodiments, first, the gain (magnitude) mismatch at DC (i.e., 0 Hz) may be calibrated by computing the average of the measured cross-correlator (xcorr 290) output, which is proportional to difference of the transfer functions' gain responses. The average can be computed by a DSP filter (e.g., included in the DSP unit 250). For instance, the average can be computed using block $\Sigma x$ 252. The calibration of the CT residue generation system 200 may proceed in an iterative fashion by adjusting either one of, or a combination of, the G(s) magnitude response, the gain of ADC1, and the magnitude response of DAC1, such that the absolute value (magnitude) of the measured average of the xcorr 290 output or response may be reduced or minimized. Examples illustrating adjusting parameters that affect G(s) and D(s) are shown in FIGS. 11-13.

In some embodiments, the phase and magnitude difference error may be corrected across higher frequency bands by minimizing the power of the residual correlation between r[n] and $V_2[n]$. One such minimization criteria may be the power (sum of squares) of the xcorr 290 output or response, as computed by a DSP filter (e.g., included in the DSP unit 250). For instance, the power can be computed using block $\Sigma x^2$ 254. Calibration can proceed in an iterative fashion by adjusting the phase responses of any one of G(s), ADC1 or DAC1 along any available degrees of freedom until the absolute value of the measured xcorr 290 output power is reduced or minimized.

Mismatches between the forward and feedforward paths are reduced when components of the test signal $x_{test}(t)$ appearing in generate $V_2[n]$, in the form of a non-zero cross-correlation between r[n] and $V_2[n]$, are reduced or minimized. A perfect calibration is attained when there are no traces of r[n] in $V_2[n]$.

Figure 3B:
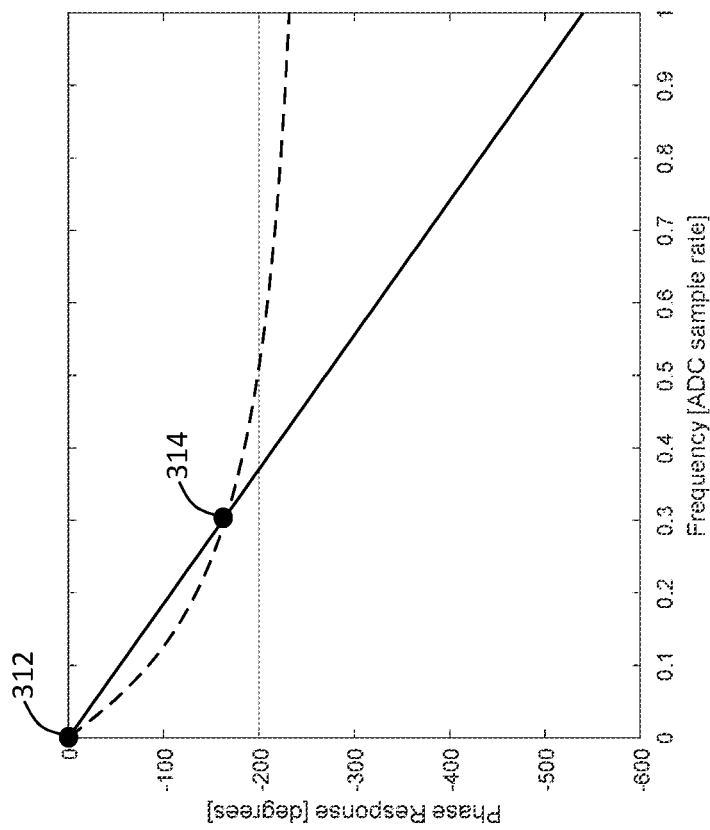
FIGS. 3A and 3B illustrate examples of uncalibrated normalized magnitude and frequency responses, respectively, of D(s) (solid line) and G(s) (dashed line) plotted over the normalized ADC sample rate, according to some embodiments of the disclosure.
Figure 3A:
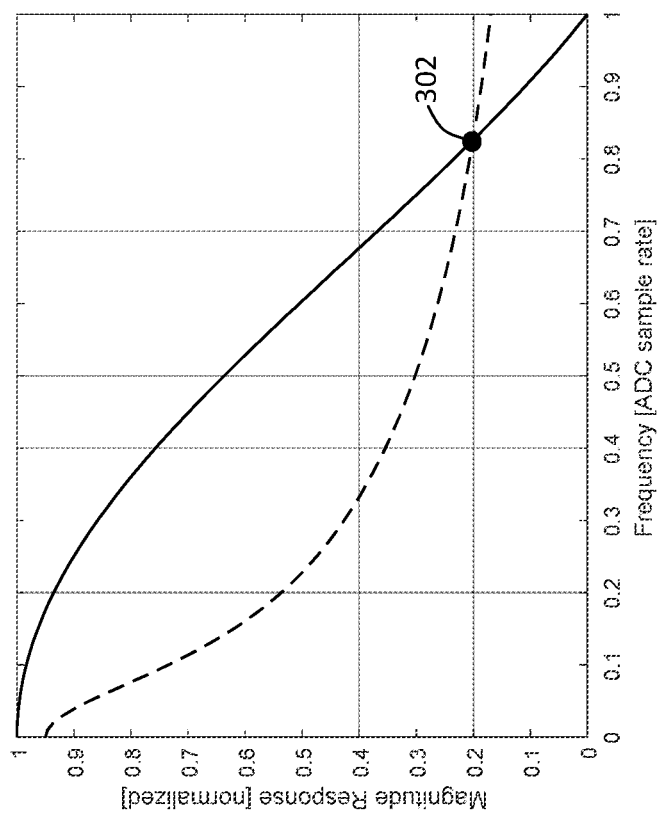

Magnitude and Phase Mismatches of an Exemplary Uncalibrated CT Residue Generation System FIG. 3A schematically illustrates an example of an uncalibrated normalized magnitude responses of D(s) (solid line) and G(s) (dashed line) plotted over the normalized frequency (or ADC sample rate). As is shown in FIG. 3A, the magnitude responses of D(s) and G(s) may be the same at some frequencies (in particular, at a point 302 shown in FIG. 3A), but they do deviate from one another at other frequencies. The DC gain mismatch error is the magnitude difference at the frequency f=0. Therefore, calibration in terms of compensating for magnitude mismatch may be beneficial for CT residue generation systems exhibiting this type of magnitude response behavior. FIG. 3B schematically illustrates an example of an uncalibrated phase responses of D(s) (solid line) and G(s) (dashed line) plotted over the normalized frequency. As is shown in FIG. 3B, the phase responses of D(s) and G(s) may be the same at some frequencies (in particular, at points 312 and 314 shown in FIG. 3B), but they do deviate from one another at other frequencies. Therefore, calibration in terms of compensating for phase mismatch may be beneficial for CT residue generation systems exhibiting this type of phase response behavior.

Figure 4:
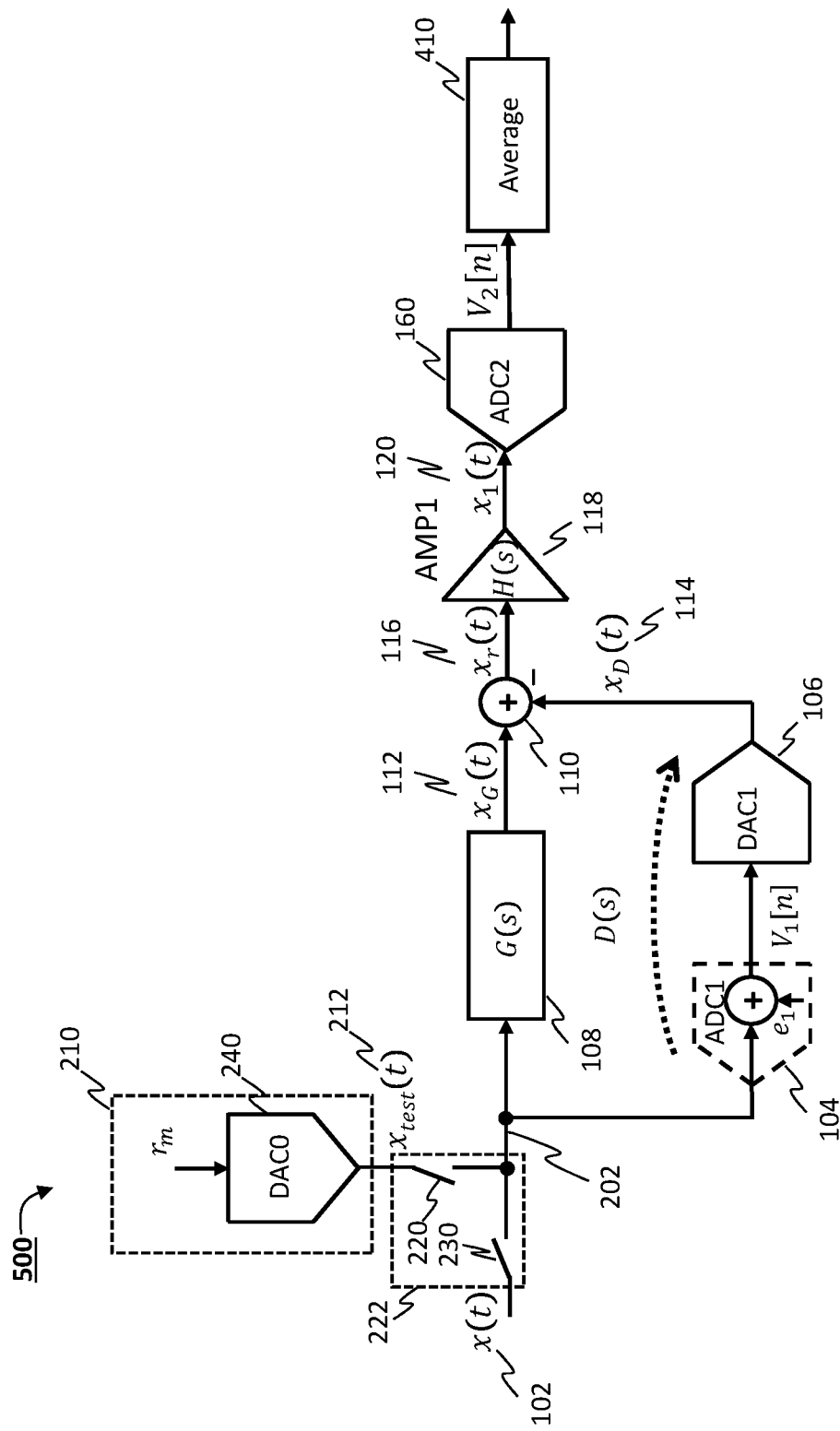
FIG. 4 provides an illustrative system diagram of a CT residue generation system to be calibrated using two-point calibration, according to some embodiments of the disclosure.
Figure 5:
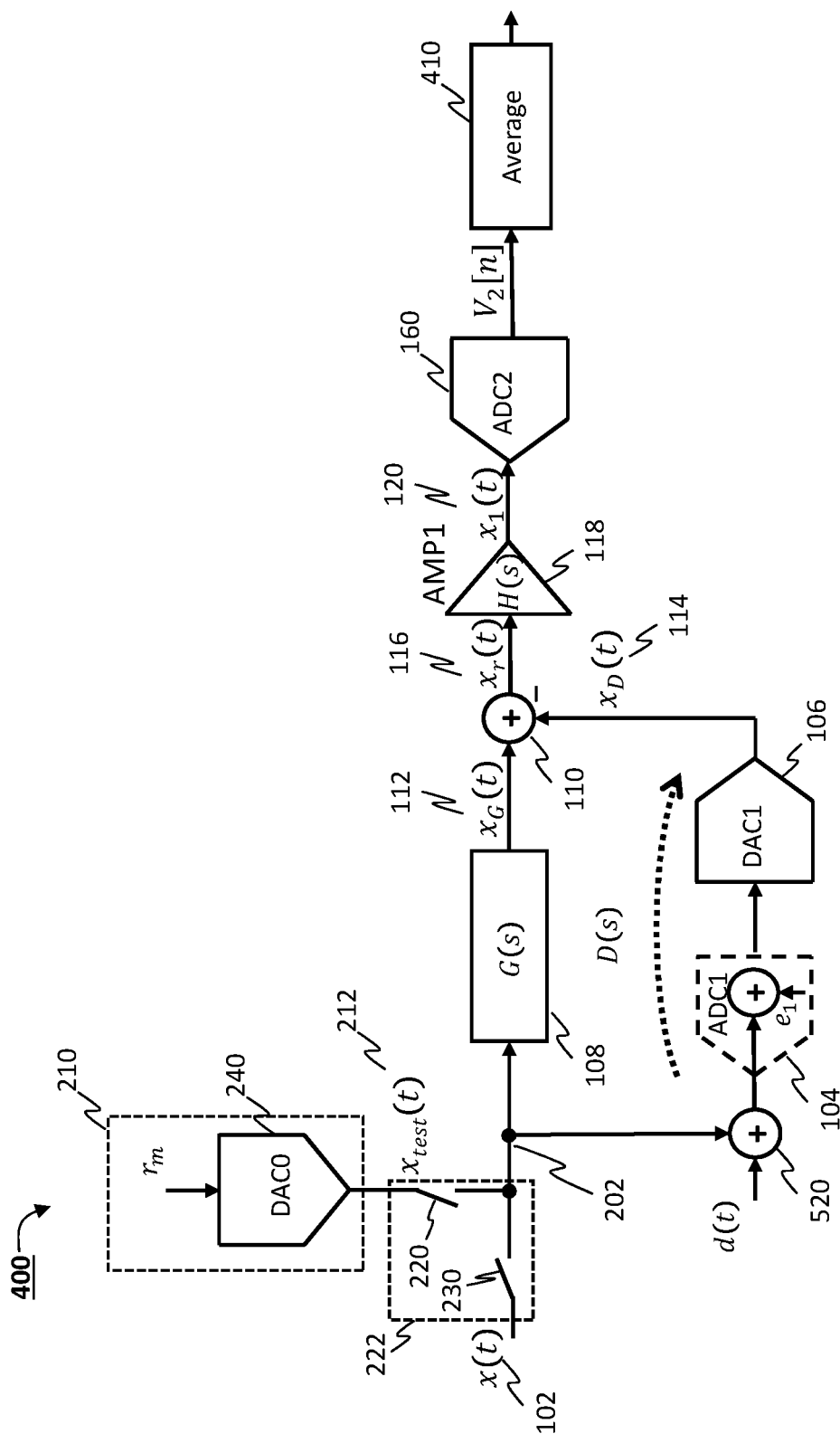
FIG. 5 provides an illustrative system diagram of a CT residue generation system to be calibrated using two-point calibration with an additive dither signal, according to some embodiments of the disclosure.

Using Two-Point Calibration to Match the DC Magnitude Response of Transfer Functions of Forward and Feedforward Paths An embodiment that is alternative to that shown in FIG. 2 may only calibrate the magnitude response of the system at 0 Hz (i.e., magnitude at DC). Such an implementation may simplify the necessary calibration hardware, because cross-correlation hardware can be obviated, and test signal generation can be simplified in some respects. An example of such an embodiment is shown in FIG. 4, providing a schematic illustration of a CT residue generation system 400 configured to be calibrated only in terms of magnitude response at 0 Hz, according to some embodiments of the disclosure. FIG. 4, as well as FIG. 5, illustrates some of the same elements as those shown in FIG. 2 (e.g., the calibration circuit 210, the test signal $x_{test}(t)$ 212, etc.) to illustrate the same, similar, or functionally analogous elements.

In some embodiments, DAC0 240 in the CT residue generation system 200 may be a high-speed DAC, converting a rapidly time-varying pseudo-random sequence r[n], while DAC0 240 in the CT residue generation system 400 may be a low-speed DAC, converting digital code values $r_m$, which may be infrequently updated. In the context of FIG. 4, DAC0 240 may represent circuitry that can generate a constant test value as the test signal $x_{test}(t)$. The function of cross-correlation and averaging of the xcorr 290 output in the embodiment of the CT residue generation system 200 may be replaced by an averaging filter 410 in the embodiment of the CT residue generation system 400. The averaging filter 410 may be configured to directly compute the average value (or a value indicative of the average value) of the $V_2[n]$ sequence of a certain length, or sufficient length. In the CT residue generation system 400, the calibration of the magnitude mismatch at 0 Hz may be carried out by performing a two-point calibration as described below.

The two-point calibration may begin with disconnecting the input signal x(t) from the CT residue generation system 400 (e.g., from node 202). By selecting an appropriate digital code $r_m$, a first test value $X_{test1}=X_A$ may be applied to the input of the CT residue generation system 400, i.e., node 202. The average of the $V_2[n]$ sequence, $V_A$, may then be computed with the constant test value $X_{test1}$ being applied. This procedure may be repeated by applying a second constant value $X_{test2}=X_B$ to compute the corresponding output average $\nabla_B$. Next, a value indicative of the difference of the measured averages $\nabla_{DIFF}=\nabla_A-\nabla_B$ may be computed. The calibration of the CT residue generation system 400 may proceed in an iterative fashion by adjusting either one of, or a combination of, the G(s) magnitude response, the gain of ADC1, and the magnitude response of DAC1, such that the absolute value (magnitude) of $\nabla_{DIFF}$ may be reduced or minimized.

Due to the CT residue generating stage to be calibrated being implemented differentially, a suitable pair of test values to be applied can sum to zero (e.g., $X_{test1}=-X_{test2}$). Applying such a pair of test values can eliminate the effect of a constant offset on the quantity being minimized. The constant offset is removed by applying the positive test value of the pair of test values, applying the negative test value of the pair of test values, and subtracting one result from the other result. The constant offset would be present in both results, thus subtraction would cancel the constant offset.

In some embodiments, a pair of test values is predetermined, and circuitry is provided to apply the predetermined pair of test values for the two-point calibration measurement. The pair of test values can be predetermined analytically or experimentally, to find an optimal pair of test values from possible pairs of test values. Exemplary methods to determine the optimal pair of test values are explained in greater detail with later figures and their accompanying description.

Using Two-Point Calibration with Dither to Match the DC Magnitude Response of Transfer Functions of Forward and Feedforward Paths Non-linearities in the forward path and feedforward path can corrupt the two-point calibration measurement. In particular, non-linearities, such as the quantization error of ADC1 104, can dominate as a key source of non-linearity in the feedforward path. In many cases, the CT filter 108 in the various figures can be sufficiently linear by design. Other sources of non-linearities can also be present in the feedforward path but are insignificant relative to the quantization error of ADC1 104. If ADC1 104 transfer function is not sufficiently linear, then the quantization error $e_1$ (schematically illustrated in FIG. 4 as an additional input to ADC1 104) may be contained in the measurements $\nabla_A$ and $\nabla_B$, compromising the two-point calibration. Other non-idealities of ADC1 104 may compromise the two-point calibration as well. Therefore, in some embodiments of two-point calibration, an appropriate dither signal d(t) may be applied to the feedforward path to randomize the quantization error $e_1$ (or other non-idealities) in the feedforward path, and thereby linearize quantizer (ADC1) 104. Several techniques can be used to randomize the quantization error $e_1$ to reduce its impact on the two-point calibration measurement.

FIG. 5 provides an illustrative system diagram of a CT residue generation system to be calibrated using two-point calibration with an additive dither signal, according to some embodiments of the disclosure. Using an additive dither signal at the input of ADC1 104 can help to linearize ADC1 104 by randomizing the quantization error $e_1$. The CT residue generation system 500 is configured to operate substantially in the same manner as described with reference to the CT residue generation system 400 except that CT residue generation system 500 includes the combiner 520 to apply the dither signal d(t). In some embodiments, the dither signal d(t) is added to a combiner 520 during calibration, for purposes of linearizing the coarse ADC1 104 (i.e., to help in randomizing the quantization error $e_1$ of ADC1 or reducing and minimizing the impact thereof).

Figure 6C:
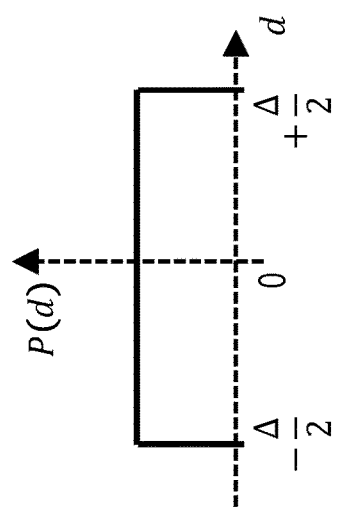
FIGS. 6C and 6D illustrate examples of, respectively, different probability density functions of suitable dither signals that can randomize the quantization error of a quantizer, according to some embodiments of the disclosure.
Figure 6D:
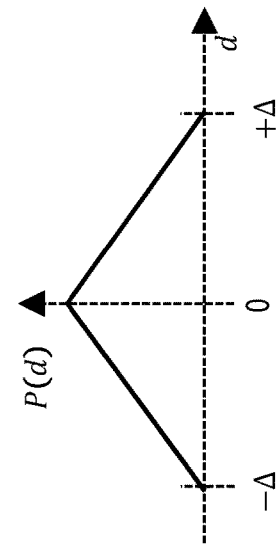

The ADC1 104 intrinsic non-linearity can be addressed by applying an appropriately shaped dither signal d(t) to its input, thereby randomizing its quantization error. The dither signal d(t) sampled by the quantizer can have a uniform probability distribution with a peak-to-peak amplitude spanning one quantization step of the ADC1 104 (referred to herein as A). An example of such probability distribution function is shown in FIG. 6C. Alternatively, the dither signal d(t) could have a triangular probability distribution spanning two quantization steps of the ADC1 104. An example of such probability distribution function is shown in FIG. 6D.

Figure 6A:
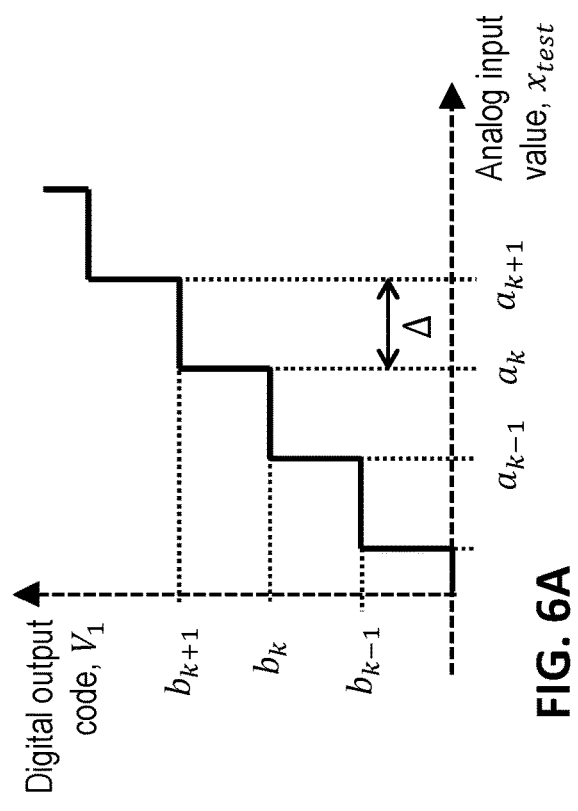
FIGS. 6A and 6B illustrate examples of, respectively, digital output code and quantization error, plotted over the analog input value, according to some embodiments of the disclosure.
Figure 6B:
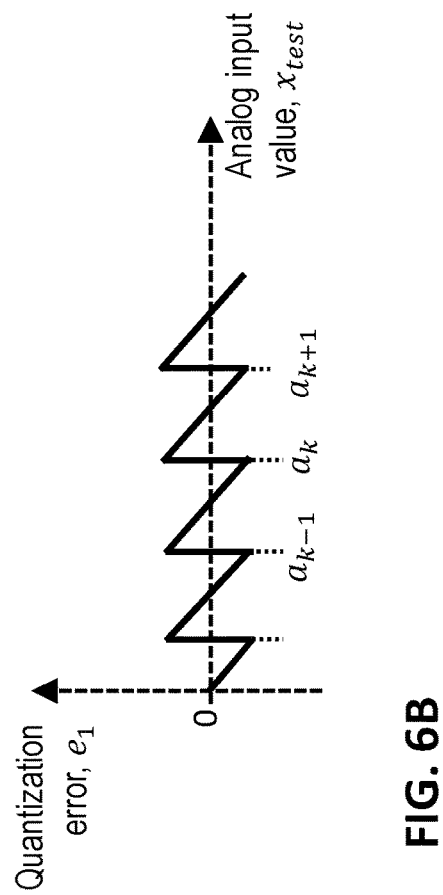

Using Two-Point Calibration with Specific Test Values to Match the DC Magnitude Response of Transfer Functions of Forward and Feedforward Paths Other embodiments of addressing the quantization error $e_1$ are based on recognition that, in some implementations, the transfer function of the quantizer ADC1 104, which may be a type of uniform quantizer, may be characterized by threshold levels $a_k$, defining the analog input value at which the digital output code transitions from $b_k$ to $b_{k+1}$, as illustrated in FIG. 6A. The difference between adjacent threshold levels $a_k$, is referred to herein as the quantization step $\Delta$. Consequently, the quantization error $e_1$ may be a function of the quantizer's analog input, as shown in FIG. 6B.

The quantization error $e_1$ may be minimal for specific values of the applied input $x_{test}$, e.g., where either $x_{test}$ is equal to the threshold value $a_k$ or $x_{test}$ is equal to the average of two adjacent threshold values $a_k$ and $a_{k+1}$. In such embodiments, the calibration procedure can proceed as before by applying these specific values of $x_{test}$ during the two-point calibration for which the quantization error is minimized and dither signal may be omitted (e.g., as seen in FIG. 4 without the additive dither signal).

Figure 7:
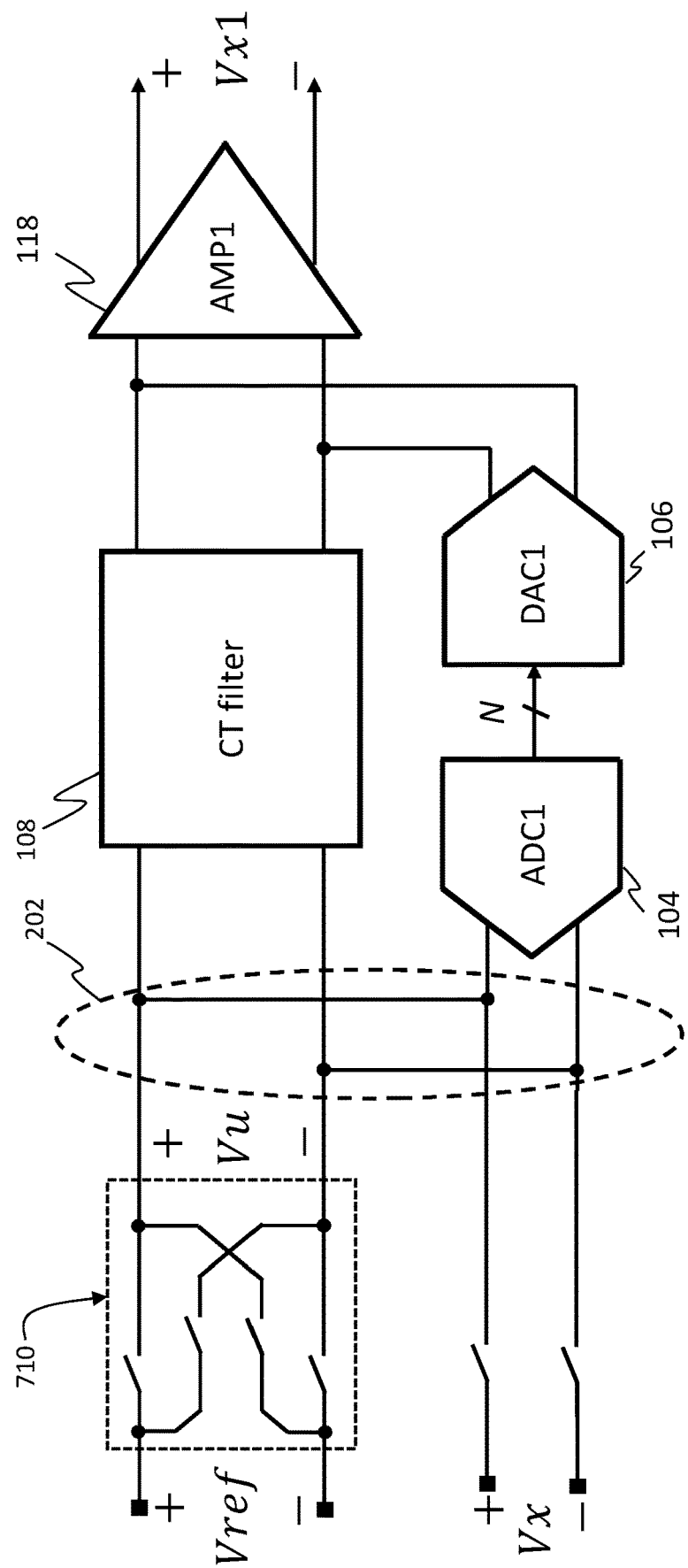
FIG. 7 provides a schematic illustration of a switching arrangement that may be used in a CT residue generation system to be calibrated with consideration to differential signaling that may be used in a CT residue generation system, according to some embodiments of the disclosure.

Circuit Implementations for Applying Specific Test Values for the Two-Point Calibration Technique FIG. 7 provides a schematic illustration of a switching arrangement 710 (sometimes referred to as a chopper) that may be used for two-point calibration of a CT residue generation system, according to some embodiments of the disclosure. The switching arrangement 710 takes advantage of the differential signaling that may be used to apply the test signal (shown in FIG. 7 as voltage Vref). Vref, i.e., the test signal, may be generated by a test voltage source (not shown explicitly in the figure). In some such embodiments, node 202 may be coupled to a test signal Vref via the switching arrangement 710 and the two different constant values of the test signal may be obtained (illustrated by Vu) by swapping the differential signal paths, or wires (e.g., by means of the switching arrangement 710), while keeping the magnitude of the test signal Vref to be the same. Thus, in such embodiments of two-point calibration, the first constant value is $X_{test1}=V_{ref}$ and the second constant value is $X_{test2}=-V_{ref}$, applied to the input (e.g., node 202) of the CT residue generation system 400 or 500 during calibration.

In other embodiments of two-point calibration, the switching arrangement 710 may be configured so that the first constant value is $X_{test1}=V_{ref}$ (or $X_{test1}=-V_{ref}$) and the second constant value is $X_{test2}=0$ (which may be achieved by, e.g., shorting the differential terminals together), or vice versa.

Multi-Point Calibration Measurement as an Alternative to the Two-Point Calibration Measurement When using a two-point calibration measurement, the mismatches are observed at a single point of the input signal range. Preferably, an optimal point is predetermined to yield the best gain calibration result. There may be some reasons for using a different technique, which makes a multi-point calibration measurement (e.g., using two or more test values) to observe the mismatches at multiple points of the input signal range. One reason may be that the optimal point of the input signal range may be unknown. Another reason may be that it is not practical to determine the optimal point a priori. Yet another reason may be that it may be preferable to observe the mismatches over a wider part or the entirety of the input signal range.

Figure 15:
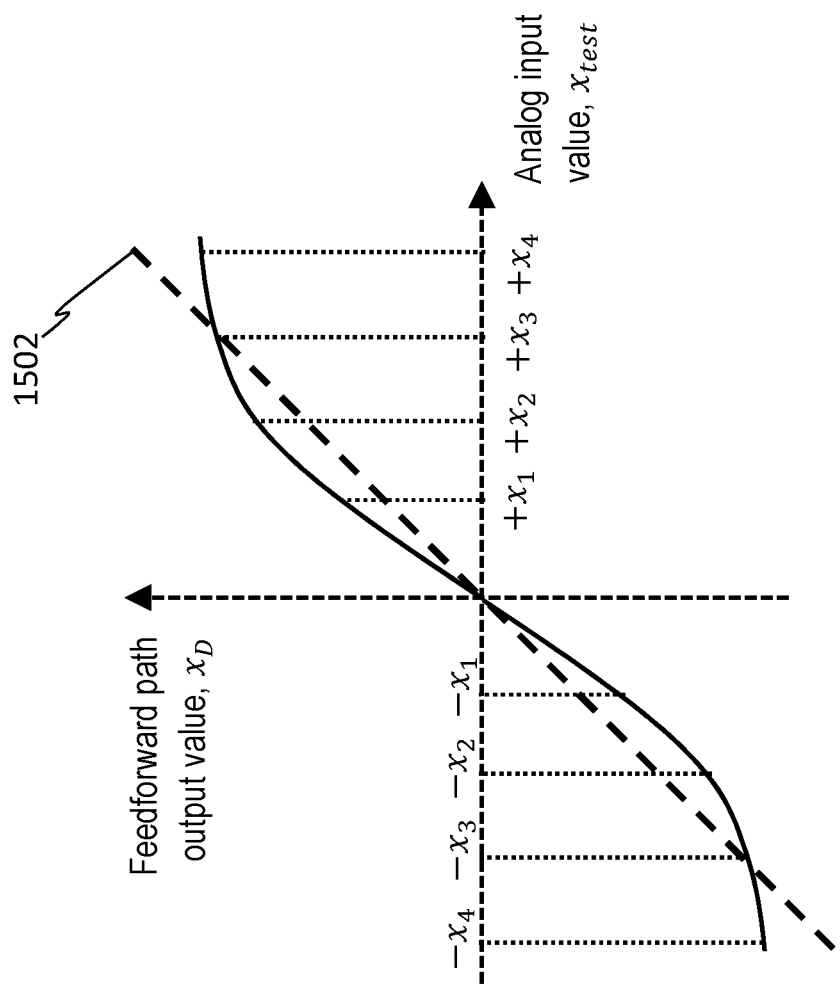
FIG. 15 illustrates that the feedforward path may be non-linear, according to some embodiments of the disclosure.

To make a multi-point calibration measurement, multiple test values are applied, and circuitry can be implemented and controlled to apply different test values. Applying different test values, e.g., different voltages, at node 202 can be performed using a multi-level DAC, e.g., DAC0 of FIG. 9 or voltage divider circuits illustrated in FIG. 8. A multi-point calibration measurement may utilize multiple or all test values that can be generated by DAC0 240 of FIG. 9 or the circuitry illustrated in FIG. 8 to characterize the mismatches of the forward and feedforward paths, even in the presence of a non-linearity in the feedforward path. The possible test values (e.g. $-x_4, \ldots, +x_4$ as seen in FIG. 15) for the multi-point calibration measurement can be uniformly or near-uniformly spaced, spanning the entirety of the intended input range, so not to bias the optimization to a particular sub-range of the input.

Figure 8:
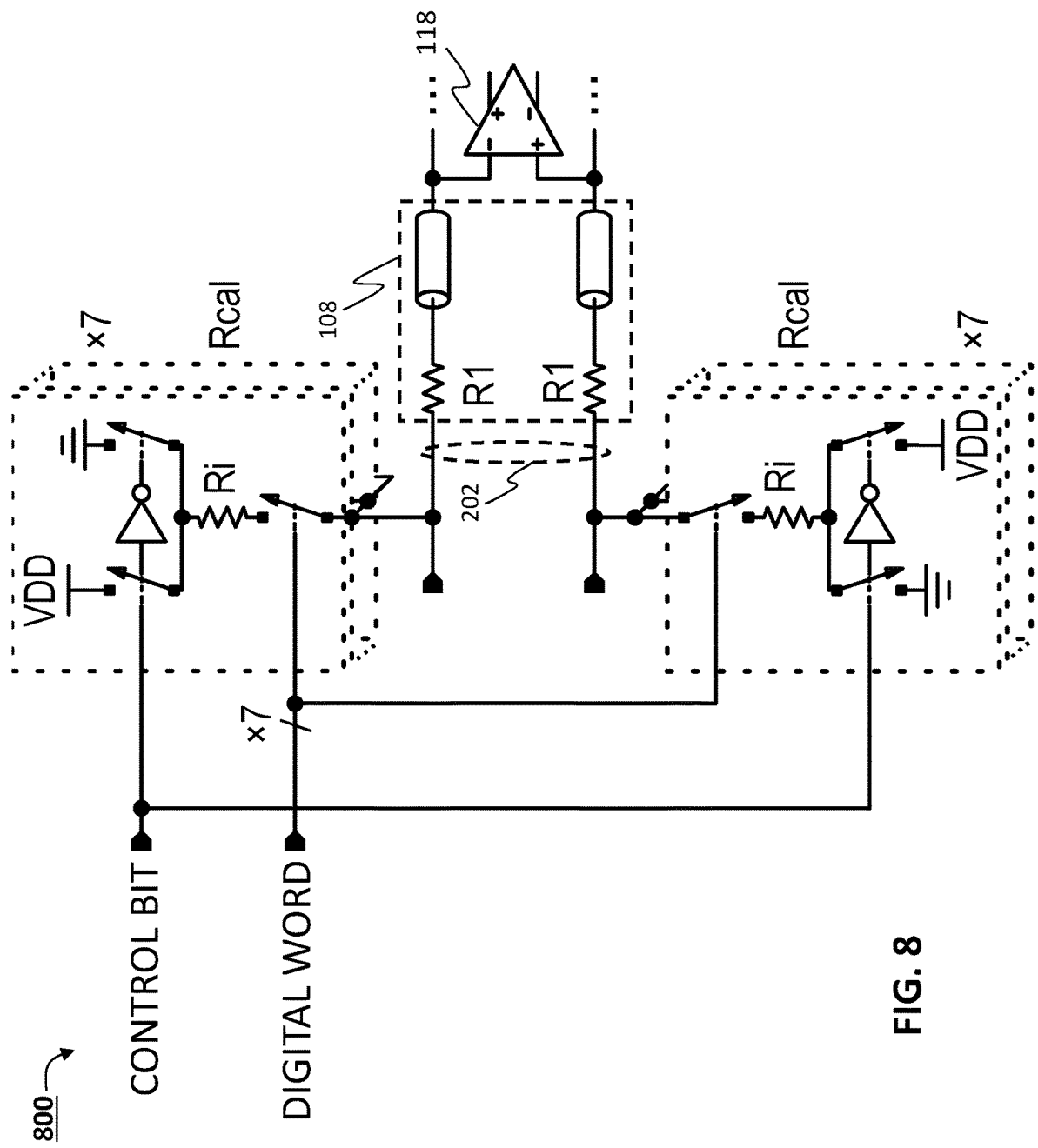
FIG. 8 provides a schematic illustration of a voltage divider circuit that may be used in a CT residue generation system to apply different test values, according to some embodiments of the disclosure.

A multi-point calibration procedure can operate in an iterative fashion by adjusting either one of, or a combination of, the G(s) magnitude response, the gain of ADC1, and the magnitude response of DAC1, such that the quantity $\Sigma \overline{V}^2$ is reduced or minimized. The quantity $\Sigma \overline{V}^2$ is the sum of the squares of the measured averages $\overline{V}$ of the $V_2[n]$ sequence corresponding to each test values that can be generated by a multi-level DAC0 (e.g., DAC0 of FIG. 9 or circuitry as illustrated in FIG. 8). In other words, different test values are applied to generate multiple $\overline{V}^2$ measurements corresponding to each possible test value. The multiple $\overline{V}^2$ measurements corresponding to each possible test value are summed to generate an aggregated measurement, $\Sigma \overline{V}^2$. The aggregated measurement, i.e., the multi-point measurement, thus represents the mismatch of the forward and feedforward paths at multiple points of input signal range.

In some cases, the differential circuit implementation of the CT residue generating stage can be leveraged to remove a constant offset by applying possible pairs of test values which sum to zero. Different pairs of test values that sum to zero can be applied to generate an aggregated measurement $\Sigma \sqrt{\overline{V_{DIFF}}^2}$, which is a sum of $\sqrt{\overline{V_{DIFF}}^2}$ measurements corresponding to each possible pair of test values. The calibration procedure thus operates in an iterative fashion by adjusting either one of, or a combination of, the G(s) magnitude response, the gain of ADC1, and the magnitude response of DAC1, such that the quantity $\Sigma \sqrt{\overline{V_{DIFF}}^2}$ is reduced or minimized. Different pairs of test values that sum to zero are applied to generate multiple $\sqrt{\overline{V_{DIFF}}^2}$ measurements corresponding to each possible pair of test values. $\overline{V}_{DIFF}=\overline{V}_{-k}-\overline{V}_{+k}$, where $\overline{V}_{-k}$ is an average of the $V_2[n]$ sequence when a negative test value of a given pair of test value is applied, and $\overline{V}_{+k}$ is an average of the $V_2[n]$ sequence when a positive test value of the given pair of test value is applied. $\overline{V}_{DIFF}$ is squared to form the $\sqrt{\overline{V_{DIFF}}^2}$ measurement. Squaring $\overline{V}_{DIFF}$ can help to emphasize correcting mismatch for test values where the mismatch is poor (e.g., where there is a large difference between the non-linear transfer function and the line of best fit 1502 of FIG. 15). Using this squared measurement can trade off some matching accuracy where the fit is good to improve matching accuracy where the fit is poor for a better fit overall. The multiple $\sqrt{\overline{V_{DIFF}}^2}$ measurements corresponding to each possible pair of test values are summed to generate an aggregated measurement, $\Sigma \sqrt{\overline{V_{DIFF}}^2}$.

Obtaining aggregated measurements based on measurements at multiple points, e.g., $\Sigma \overline{V}^2$ or $\Sigma \sqrt{\overline{V_{DIFF}}^2}$, can allow the mismatch between the forward and feedforward paths to be minimized along the entirety of the input signal range, rather than only at one specific point as determined by a two-point calibration when the nature of the feedforward non-linearity may be unknown a priori.

Circuit Implementations for Applying Specific Test Values for the Two-Point Calibration Technique and Multi-Point Calibration Technique FIG. 8 provides a schematic illustration of a voltage divider circuit 800 that may be used in a CT residue generation system to apply different test values, according to some embodiments of the disclosure. Voltage divider circuit 800 can function as DAC0 240, where the amount of voltage to be applied at node 202 can be controllable by a digital word.

Input resistances R1 together with the circuitry that follows, e.g., transmission line, form the CT filter 108. The voltage divider circuit 800 includes the input resistances R1, and a bank of resistances Ri. A differential arrangement is shown as illustration, with one set of parallel resistances Ri coupled to a first differential side of node 202, and another set of parallel resistances Ri coupled to a second differential side of node 202. The two sets of parallel resistances corresponding to the differential sides are complementary. As an illustration, the set of parallel resistances Ri on one differential side has 7 parallel resistors but other number of parallel resistors can be used, depending on the desired amount of tunability.

Each resistance Ri has a first terminal that is switchably controllable to be coupled to node 202 and a second terminal that is switchably controllable to be coupled to one of the supply voltages or voltage supplies (VDD or ground in this example). Resistances Ri can have the same resistance (unary weighted) or can have different resistances (e.g., binary weighted). The bits of the digital word can select resistances Ri to be coupled to node 202. Specifically, a bit of the digital word controlling the voltage divider circuit 800 couples the first terminal of a corresponding resistance Ri to node 202. The digital word can controls the equivalent resistance Rcal of the bank of parallel resistances Ri. The digital word can control selection switches that couple respective first terminals of the resistances to common node 202. A control bit controlling the voltage divider circuit 800 couples the second terminals of the resistances Ri to either one of the two supply voltages. The control bit can control a control switch that couples the second terminals of the resistances to one of two voltage supplies. If second terminals of the resistances Ri in one set of parallel resistances are coupled to a first supply voltage, then second terminals of the resistances Ri in the complementary set of parallel resistances are coupled to a second supply voltage. Polarity of the voltage being applied by the voltage divider circuit 800 can be swapped or chopped (without an explicit chopper circuit) by alternating the complementary connections of the second terminals of the parallel resistances Ri to one of the supply voltages. In some embodiments, the second terminals of one set of parallel resistances are coupled together at a single node, which can be coupled to one of the two supply voltages. In some embodiments, the second terminals of one set of parallel resistances individually connect to a same supply voltage.

Resistances R1 are a part of the CT filter 108 in the forward path. R1, and calibration resistance Rcal together form a voltage divider circuit. The test voltage being applied, in this illustration $V_{ref}$ can be computed by this equation:

$$Vref = \pm VDD \frac{2R1}{2R1 + 2Rcal}.$$

Rcal is a digitally tunable resistance. Rcal represents the equivalent resistance of the parallel resistor(s) selected from the bank of resistances Ri to be coupled to node 202. Test voltage polarity can be determined by Rcal being connected to the appropriate voltage supply (e.g., VDD or ground). Rcal is only connected to node 202 during calibration (is disconnected from node 202 when not calibrating the ADC), to reduce loading on the ADC input during normal operation. The voltage divider circuit arrangement thus allows different test values and different polarities of the different test values to be applied to node 202 for calibration, by tuning Rcal and changing whether the voltage divider circuit is connected to VDD or ground.

Providing an Input Signal Driver with Programmable Gain to Decouple the Forward and Feedforward Paths from Receiving the Input Signal x(t)

In some implementations, an explicit switch 230 to decouple node 202 from receiving the input signal x(t) is not implemented. Instead, an input signal driver can be programmed to have a gain of 0 to null the input signal x(t). An input signal driver can be provided to usually drive the ADC, or other signal processing circuitry having a specific transfer function can precede the ADC in the signal chain. Examples of the input signal driver can include a buffer, an amplifier, active circuit, or passive circuit. The input signal driver may have unity gain or non-unity gain, depending on the implementation. An input signal driver can be provided to satisfy speed and performance requirements of the target application. Making the input signal driver programmable to have a gain of 0 serves to provide dual purpose of (1) buffering, filtering, and/or driving functionality for the ADC, and (2) the switching functionality of switch 230.

FIG. 9 provides an illustrative system diagram of a CT residue generation system 900 having a programmable input signal driver 902 to receive or not receive an analog input x(t) 102, according to some embodiments of the disclosure. The input signal driver 902 (buffer or amplifier) can have a programmable gain. The case when the programmable gain of the input signal driver 902 is 0 corresponds precisely to the configuration where the switch 230 (seen in FIG. 2) is open and x(t) 102 is isolated from the system.

The calibration can still be performed when the input signal driver 902 has a programmable gain that is greater than 0, at the cost of having to compute a longer cross-correlation length to achieve a comparable measurement accuracy to the case when the programmable gain is equal to 0.

Figure 10:
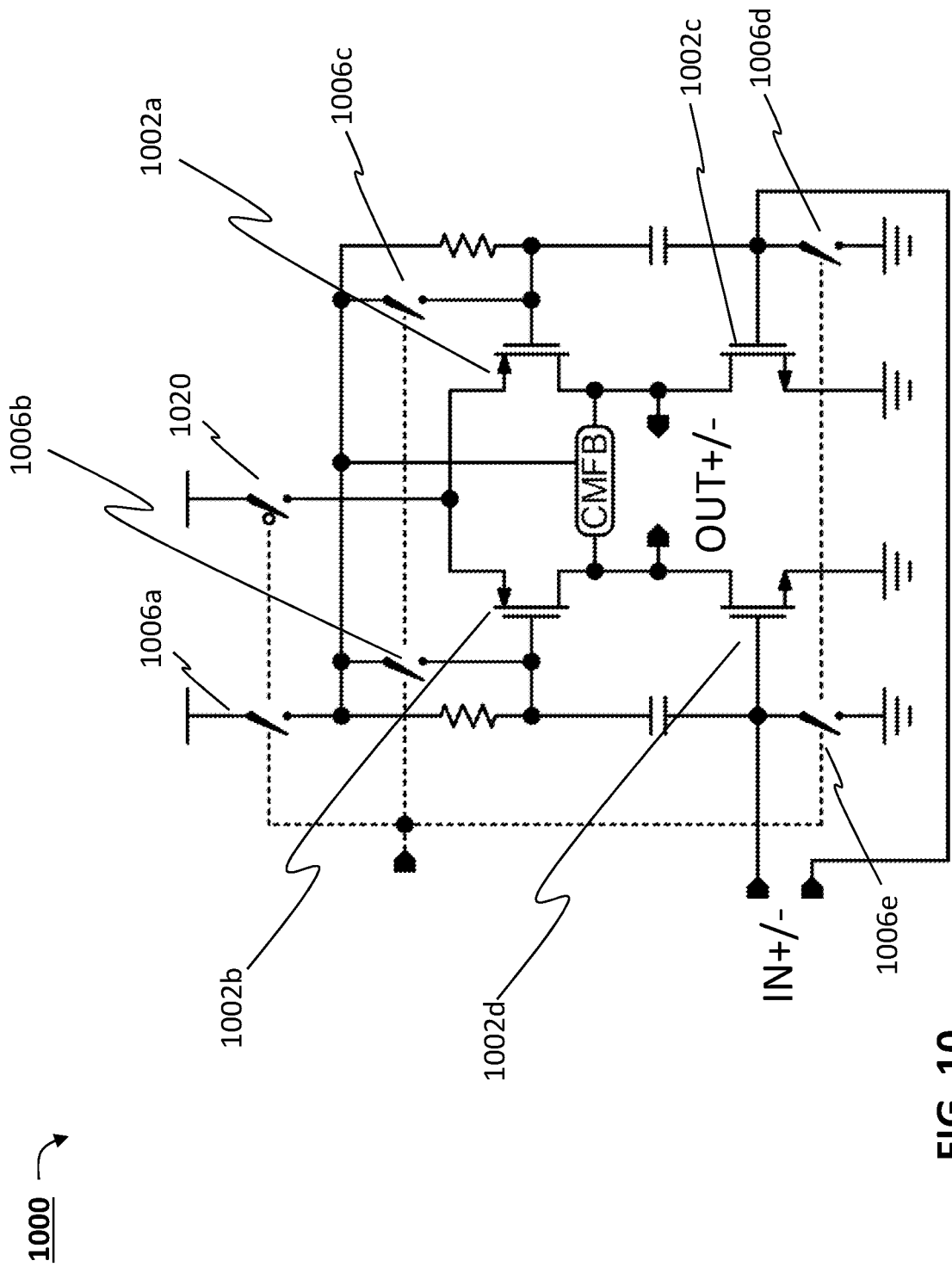
FIG. 10 provides a schematic illustration of an input signal driver with programmable gain that may be used in a CT residue generation system, according to some embodiments of the disclosure.

FIG. 10 provides a schematic illustration of an input signal driver with programmable gain that may be used in a CT residue generation system, according to some embodiments of the disclosure. The input signal driver with programmable gain can include a two-stage transimpedance amplifier (TIA) design, and FIG. 10 illustrates an output stage 1000 that can be "turned off" such that x(t) 102 is isolated from the system, and the test signal $x_{test}(t)$ can be applied to node 202, and the gain of input signal driver is substantially 0. In normal operation, it is configured as an inverter-like push-pull structure, with the p-type metal-oxide semiconductor (PMOS) transistor devices 1002a and 1002b providing current from the supply voltage through a shorted switch 1020. The input signal driver can be disabled by opening the switch 1020 providing quiescent current to the output stage, while shorting all other control switches 1006a-e at the gates of the transistor devices 1002a-d. In this configuration, the transistor devices 1002a-d in the output stage 1000 become biased in the cut-off region, and the programmable input buffer achieves a high output impedance. Shorting switches 1006a-e together with opening the switches in series with the input signal driver's feedback resistors (the switches are not shown in FIG. 10 but in FIG. 13's programmable input buffer 902), the high output impedance of the input signal driver breaks any forward path of the CT analog input signal x(t) 102 to the ADC and allows the ADC's input voltage to be controlled by DAC0 240.

Tuning the Analog Circuitry to Modify the Transfer Functions of the Forward and Feedforward Paths FIG. 11 provides a schematic illustration of a feedforward DAC (e.g., DAC1 106) with digitally trimmable current that may be used in a CT residue generation system to adjust the transfer function of the feedforward path, according to some embodiments of the disclosure. The feedforward DAC1 106 has N current-steering DAC elements 1102, which are coupled with an additional circuit element $DAC_{trim}$ 1104 used for calibrating the full-scale current of the feedforward DAC1 106. Trimming the current of the feedforward DAC1 106 is equivalent to adjusting the gain of the DAC, and therefore, the gain or magnitude response of the feedforward path. The differential current from the output terminals OP/ON is the electrical representation of the feedforward path output $x_D(t)$ 114.

FIG. 11 illustrates a single-sided differential N-element current-steering DAC. Each current-steering DAC element has a PMOS switching pair of transistors 1106a-b, which steer the current generated by transistor MPn either to the OP or ON output terminals depending on the corresponding bit from digital input word V1<N:1> that the element receives. The dashed boxes indicate that multiple equivalent circuit elements are connected in parallel, and elements may be of equal size. Therefore, the full-scale current is defined to be $N \times I_{LSB}$, which is the peak differential output current that can be generated by the DAC when the current of each element is steered to one of the two differential outputs, OP or ON, by applying the largest (all 1s) or smallest (all 0s) value for the DAC's unary-coded digital input word V1<N:

1>. The <N:1> array notation designates a unique wire is used for controlling the output of each of the N elements.

A reference current $I_{ref}$ is used to define the nominal full-scale current of the DAC. The unit element current $I_{LSB}$ is related to $I_{ref}$ by the gain of the current mirrors MN1:MN2 and MP2:MPn, referred to as $k_1$ and $k_2$, respectively. Thus, the nominal value of $I_{ref}$ is determined by the design choice of the mirror ratios and the reference current itself, such that $I_{LSB}=k_1 \times k_2 \times I_{ref}$.

The same concepts apply to a N-element binary current-steering DAC implementation, in which, starting from the smallest element with a current $I_{LSB}$, the current is doubled in each subsequent element (eg. $2I_{LSB}, 4I_{LSB}$, etc), or a general N-element sub-binary radix current-steering DAC, in which each subsequent element is scaled by a factor x (e.g., $xI_{LSB}, x^2I_{LSB}$, etc).

Due to mismatches introduced during manufacture in the device parameters of the transistors comprising the current mirrors, and/or the process variation and device mismatches of the circuit generating $I_{ref}$, the actual full-scale current $N \times I_{LSB}$ will deviate from the intended design target. To correct for this random variation, a small trim current $I_{trim}$ can be applied by a single-ended $DAC_{trim}$ 1004. The trim current $I_{trim}$ changes the nominal current being steered by each current-steering DAC element $I_{LSB}$. The direction of $I_{trim}$ current will depend on the polarity of the full-scale error being corrected. With the directions as defined by the figure, the resultant element current will be $I_{LSB}=k_1 \times k_2 \times I_{ref} - k_2 \times I_{trim}$.

FIG. 12 provides a schematic illustration of a tunable CT filter 108 that may be used in a CT residue generation system to adjust the transfer function of the forward path, according to some embodiments of the disclosure. The tunable CT filter 108 includes a differential delay line circuit realizing the forward path analog filter response G(s). The differential voltage applied to the input terminals on the left is the electrical representation of the CT analog input signal x(t) 102 (during normal operation). The differential current from the output terminals on the right is the representation of the filtered output signal $x_G(t)$ 112.

The tunable CT filter 108 is implemented by a series connection of resistors, and an arrangement of shunt (e.g., C1) and/or cross-coupled (e.g., C2) capacitive elements, which determine the frequency response of the tunable CT filter 108. Each capacitor is subdivided into multiple sub-elements that can be combined in parallel when connected to the circuit by the corresponding switch. The sub-elements may be binary, unary, or sub-binary radix-scaled, with the desired capacitor value selected by the digital word applied to the switches. The selection word may be level shifted or otherwise transformed by a switch driver circuit (not shown) before being applied to the switches. By changing the digital word applied to the switches to change the desired capacitor values, the phase response of the forward path (i.e., the phase component of G(s) frequency response of the CT filter 108) can be adjusted.

An Exemplary Circuit Implementation of the CT Residue Generation System

FIG. 13 provides a schematic illustration of a CT residue generation system having a programmable input buffer 902, DAC0 240 to inject test signals, ADC1 106, a feedforward DAC1 106 with digitally trimmable current, a tunable CT filter 108, and filter 118, according to some embodiments of the disclosure.

The programmable input buffer 902 can be configured to open switches of the feedback resistors (and change the gain of input buffer 902 to zero as discussed with FIG. 10) to decouple node 202 from receiving the input signal. The parallel combination of a resistor and capacitor in feedback of the programmable input buffer 902 defines the buffer's gain and filtering characteristics. Adding a switch to the feedback resistor and opening the switch can provide the desired function of making the buffer 902 operate as an open switch during ADC calibration, effectively isolating the CT analog input signal x(t) 102 from the ADC (node 202). When node 202 is decoupled to receive the input signal, test signals can be applied to node 202 by DAC0 240 when switches 220 are closed.

In the embodiment illustrated in FIG. 13, DAC0 240, in combination with the resistors in the tunable CT filter 108 form a half-bridge circuit that can generate discrete-level differential voltage values at the input of the ADC used for calibration. The circuit structure is similar to the circuit illustrated in FIG. 8. DAC0 240 has two identical structures (one for the each side of the differential circuit). The structures include multiple elements connected in parallel. Each parallel element of the structure is implemented by a switch 220, a resistor of fixed value, and a selection switch that can connect the end of the resistor to either ground or a positive voltage supply. The selection switches in each element are complementary, such that if one side of the differential input is connected through the DAC0 resistor to ground, the other differential side is connected through the DAC0 resistor to the positive supply. The DAC0 240's output value is determined by the control word applied to switches 220, which determine the number of elements on each side connected to the ADC input nodes. When not used for calibration, DAC0 240 is isolated from the rest of the system by opening switches 220 in all of the parallel elements.

Exemplary Xcorr Output or Response

FIG. 14 shows exemplary cross-correlation results hinting that the forward and feedforward paths are mismatched, according to some embodiments of the disclosure. The result of a single iteration of a calibration measurement is a cross-correlation (output or response of xcorr 290) response of the residual leakage of the applied test signal due to imperfect matching of the forward and the feedforward paths. The response demonstrates non-zero values for a certain range of xcorr lags (as values of the response), and negligibly small values outside of this range.

The mean of the xcorr 290 response's values corresponds to the magnitude error between the forward and feedforward paths, and the sign of the mean indicates relative magnitude of the forward path compared to the feedforward path. An appropriate search algorithm can be used to converge to a measurement having a mean of zero by adjusting the gain of the ADC1 104, DAC1 106, and/or CT filter 108.

It should be noted that computing the mean of the xcorr 290 output response is equivalent to directly computing the average of the output data of $V_2[n]$ if no other input sources are applied, which would be the case during foreground calibration with the ADC disconnected from the input and other sources of dither being deactivated (with possible exception the dither added at the input of the ADC1 at combiner 520).

The objective of the phase response calibration is to minimize the power of the applied test signal in the residue, which corresponds to the best achievable forward and feed-forward paths matching given the constraints imposed by the specific implementation of ADC1 104, DAC1 106 and CT filter 108, as well as the limited degrees of freedom afforded by the tuning implementation of those components.

It may be unrealistic to make the frequency responses of the forward and feedforward paths match precisely except at a finite number of frequency points. Finding the residual power of the applied dither is accomplished by computing the sum of squares of the xcorr 290 output response. An appropriate search algorithm can then use this metric, as well as any additional information from the xcorr 290 output response itself to determine the manner in which to adjust the controllable parameters of the forward and feedforward paths with the provided degrees of freedom to minimize the squared value.

SELECTED EXAMPLES

Example 1 is a continuous-time residue generation system, comprising: a forward path, comprising a continuous-time filter (e.g., 108); a feedforward path in parallel with the forward path, comprising an analog-to-digital converter (e.g., 104) followed by a digital-to-analog converter (e.g., 160); a further digital-to-analog converter (e.g., 204) couplable to a common input node (e.g., 202) of the forward path and the feedforward path to inject a test signal (e.g., 212); a filter (e.g., 118) to receive a difference between outputs of the forward path and the feedforward path; a further analog-to-digital converter (e.g., 106) to receive the filtered difference; a calibration circuit (e.g., 250, or 410) to receive a digital output of the further analog-to-digital converter; wherein at least one of the forward path and the feedforward path have at least one circuit that is responsive to the calibration circuit.

In Example 2, Example 1 can optionally include a first switch (e.g., 230) to decouple an analog input signal from the common input node of the forward path and the feedforward path when the test signal is being injected.

In Example 3, Example 1 or 2 can optionally include a second switch (e.g., 220) to couple the test signal from the further digital-to-analog converter to the common input node.

In Example 4, any one of Examples 1-3 can optionally include: a programmable input signal driver (e.g., 902) controllable have a high output impedance when the test signal is injected to the common input node of the forward path and the feedforward path.

In Example 5, any one of Examples 1-4 can optionally include the analog-to-digital converter in the feedforward path being to further receive a dither signal while the test signal is applied to the common input node of the forward path and the feedforward path. See e.g., FIG. 5.

In Example 6, any one of Examples 1-5 can optionally include the continuous-time filter in the forward path comprising an arrangement of shunt capacitive elements to provide a specific capacitor value based on an output of the calibration circuit. See e.g., FIGS. 12, and 13.

In Example 7, any one of Examples 1-6 can optionally include the continuous-time filter in the forward path comprising an arrangement of cross-coupled capacitive elements to provide a specific capacitor value based on an output of the calibration circuit. See e.g., FIGS. 12, and 13.

In Example 8, any one of Examples 1-7 can optionally include the digital-to-analog converter in the feedforward path comprising a circuit to trim a full-scale current of the digital-to-analog converter based on an output of the calibration circuit. See e.g., FIGS. 11, and 13.

In Example 9, any one of Examples 1-8 can optionally include the further digital-to-analog converter circuit comprising a test voltage source to generate the test signal and switching arrangement to apply the test signal or the test signal of opposite polarity. See e.g., FIGS. 7, 8, and 13.

In Example 10, any one of Examples 1-9 can optionally include the further digital-to-analog converter circuit forming a half-bridge circuit with the continuous-time filter to inject the test signal. See e.g., FIGS. 8, and 13.

In Example 11, any one of Examples 1-10 can optionally include the further digital-to-analog converter circuit including parallel elements, each parallel element comprising (1) a selection switch to couple the parallel element to the common input node of the forward path and the feedforward path, (2) a resistance, and (3) a control switch to couple the resistance to one of two voltage supplies. See e.g., FIGS. 8, and 13.

In Example 12, any one of Examples 1-11 can optionally include wherein the calibration circuit including a digital signal processor.

In Example 13, any one of Examples 1-12 can optionally include the calibration circuit including digital circuitry.

In Example 14, any one of Examples 1-13 can optionally include the calibration circuit including a cross-correlation block (e.g., 290) to receive the digital output of the further analog-to-digital converter and the test signal.

In Example 15, Example 14 can optionally include a further filter (e.g., 270) to receive the test signal and output a filtered test signal as the test signal to the cross-correlation block.

In Example 16, any one of Examples 1-15 can optionally include the calibration circuit including an averaging filter (e.g., 252, and 410).

In Example 17, any one of Examples 1-16 can optionally include the calibration circuit including a summation block (e.g., 252).

In Example 18, any one of Examples 1-17 can optionally include the calibration circuit including a sum of squares block (e.g., 254).

Example 19 is a method to reduce mismatch of transfer functions of a forward path and a feedforward path of a continuous-time residue generation circuit, comprising: applying a test signal to a common input node of the forward path and the feedforward path; filtering a difference between outputs of the forward path and the feedforward path; digitizing the filtered difference to generate a digital output; measuring the mismatch of the transfer functions based on the digital output, which is generated as a result of the test signal being applied at the common input node; and adjusting one or more circuits in the forward path and/or the feedforward path to reduce the measured mismatch.

In Example 20, Example 19 can optionally include applying the test signal comprising: receiving a pseudo-random sequence; generating a pseudo-random analog test signal based on the pseudo-random sequence; and injecting the pseudo-random analog test signal as the test signal to the common input node.

In Example 21, Example 19 or 20 can optionally include measuring the mismatch of the transfer functions comprising cross-correlating the digital output and the test signal.

In Example 22, Example 21 can optionally include measuring the mismatch of the transfer functions further comprising computing a mean of an output of the cross-correlation.

In Example 23, Example 21 or 22 can optionally include measuring the mismatch of the transfer functions further comprising computing a sum of squares of an output of the cross-correlation.

In Example 24, any one of Examples 19-23 can optionally include applying the test signal comprising applying a test value as the test signal.

In Example 25, Example 24 can optionally include the test value to be applied as the test signal being optimally selected from a plurality of possible test values.

In Example 26, Example 24-25 can optionally include measuring the mismatch of the transfer functions comprising computing an average value of a sequence of a predetermined length of the digital output.

In Example 27, any one of Examples 24-26 can optionally include applying a further test value as a further test signal to the common input node of the forward path and the feedforward path; wherein measuring the mismatch of the transfer functions is further based on a further digital output generated as a result of the further test signal being applied at the common input node.

In Example 28, Example 27 can optionally include measuring the mismatch of the transfer functions comprising: computing a first average value of a sequence of a certain length of the digital output; computing a second average value of a sequence of a certain length of the further digital output; and computing a difference of the first average value and the second average value.

In Example 29, Example 27 or 28 can optionally include the test value to be applied as the test signal and the further test value to be applied as the further test signal being optimally selected from a plurality of pairs of test values that sum to zero.

In Example 30, any one of Examples 24-29 can optionally include applying further test values as further test signals to the common input node of the forward path and the feedforward path; wherein measuring the mismatch of the transfer functions is further based on the further digital outputs generated as a result of the further test signals being applied at the common input node.

In Example 31, any one of Examples 19-30 can optionally include adjusting one or more circuits in the forward path and/or the feedforward path comprising adjusting the one or more circuits iteratively.

In Example 32, any one of Examples 24-31 can optionally include linearizing the feedforward path while the test signal is applied.

In Example 33, any one of Examples 24-32 can optionally include randomizing a quantization error of an analog-to-digital converter in the feedforward path while the test signal is applied.

In Example 34, any one of Examples 24-33 can optionally include the test signal having a value which is equal to a threshold value of an analog-to-digital converter in the feedforward path.

In Example 35, any one of Examples 24-33 can optionally include the test signal having a value which is equal to an average of two adjacent threshold values of an analog-to-digital converter in the feedforward path.

Example 36 is a continuous-time pipelined analog-to-digital converter, comprising: a continuous-time residue generation circuit having a forward path, a feedforward path, and a node to combine outputs from the forward path and the feedforward path, wherein the forward path and the feedforward path process a same input; test signal injection circuit to apply a test signal to the input of the continuous-time residue generation circuit; a quantizer to quantize the combined outputs from the forward path and the feedforward path; and a calibration circuit to observe a digital output of the quantizer generated as a result of the test signal being applied and to cause change in the forward path and/or the feedforward path in response to observing the digital output; wherein the digital output indicates whether the forward path and the feedforward path are mismatched.

In Example 37, Example 36 can optionally include a further continuous-time residue generating circuit having a further forward path, a further feedforward path, and a further node to combine outputs from the further forward path and further feedforward path, wherein the further continuous-time residue generating circuit generates the input to the continuous-time residue generating circuit.

In Example 38, Example 36 or 37 can optionally include circuitry to decouple an output signal of the further continuous-time residue generation circuit from an input node of the continuous-time residue generating circuit.

In Example 39, any one of Examples 36-38 can optionally include the forward path comprising a programmable continuous-time delay line that is responsive to the calibration circuit.

In Example 40, any one of Examples 36-39 can optionally include the feedforward path comprising a digital-to-analog converter whose gain is responsive to the calibration circuit.

In Example 41, any one of Examples 36-40 can optionally include the calibration circuit comprising a cross-correlator to cross-correlate the digital output and the test signal, and the test signal is a pseudo-random signal.

In Example 42, any one of Examples 36-41 can optionally include the calibration circuit comprising an averaging filter to compute an average of a fixed length sequence of the digital output, and the test signal is a static signal.

In Example 43, any one of Examples 36-42 can optionally include the forward path having a transfer function which is responsive to the calibration circuit.

In Example 44, any one of Examples 36-43 can optionally include the feedforward path having a transfer function which is responsive to the calibration circuit.

In Example 45, any one of Examples 36-44 can optionally include the test signal injection circuit being to apply a test value and chopped version of the test value as the test signal to the input of the continuous-time residue generation circuit.

In Example 46, any one of Examples 36-45 can optionally include the test signal injection circuit being to apply further test signals different from the test signal to the input of the continuous-time residue generation circuit.

VARIATIONS AND IMPLEMENTATIONS

As the foregoing illustrates, calibration of a CT residue generation system may be performed by disconnecting the input signal and applying a pseudo-random sequence to the input of the CT residue generation system, e.g., by means of a DAC. Cross-correlation of the backend ADC output with the injected dither signal may be used to measure the residual dither component in the calibrated stage's residue. Such a calibration approach may be applied to calibrate the static gain error between the forward path and the feedforward path by reducing or minimizing the average of the cross-correlator output. Such a calibration approach may be applied to calibrate the phase and/or frequency-dependent magnitude mismatch between the forward path and the feedforward path by reducing or minimizing the power (sum of squares) of the cross-correlator output. Two-point calibration is a simplified version of such a calibration approach, where a static signal may be applied in place of, or in addition to, a fast-varying pseudo-random signal and the average of the backend output may be computed in place of the cross-correlator output. The static signal is applied twice with different values to perform the two-point calibration technique. The circuitry can be programmed apply different pairs of values (summing to zero) for the two-point calibration technique. For instance, an optimal pair of values can be selected and applied.

This calibration method can be extended to a CT pipeline ADC having more than a single CT residue generation stage. The N-th stage of a CT pipeline ADC may then be calibrated using the calibration techniques described herein by applying the pseudo-random and/or static test signal to the N-th stage's input, while disconnecting the output of the (N−1)-th stage, and utilizing the (N+1)-th and subsequent stages to measure/digitize the N-th stage's residue signal.

Embodiments of the disclosure provide mechanisms for performing calibration of CT residue generation systems to account and compensate for magnitude and/or phase variations/mismatches that may be caused by fabrication processes used to fabricate the systems and/or temperature/voltage variations during operation of the systems. In particular, calibration may be performed by providing one or more known test signals as an input to a CT residue generation system, analyzing the output of the system corresponding to the known input, and then adjusting one or more parameters of a forward and/or a feedforward path of the system so that the difference in transfer functions of these paths may be reduced/minimized. CT residue generation systems using test signals may help decrease the magnitude of the residue signals generated by such systems, and, consequently, advantageously increase an error correction range of such systems or of further stages that may use the residue signals as input.

Mechanisms described herein may be applicable to CT as well as hybrid (i.e. part CT, part DT) ADCs and may be implemented in ADCs of various types of architectures, such as e.g. pipelined ADCs, multi-stage noise shaping (MASH) ADCs, voltage controller oscillator (VCO) ADCs, and other ADCs utilizing generation and processing of residue signals. Some of the mechanisms described herein may be especially attractive for high-performance and high-speed converter applications. Techniques to calibrate for mismatches in transfer functions in the forward and feedforward paths are particularly useful for CT residue generation systems because the analog circuit components in the CT residue generation systems are more likely to have process, temperature, and voltage variations, thereby exacerbating the amount of tolerable phase and magnitude mismatches between the forward and feedforward paths.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

Descriptions of elements provided with respect to the various figures are applicable to other figures having elements with the same reference numerals, so that, in the interests of brevity, these descriptions are not repeated and only the differences are described.

As will be appreciated by one skilled in the art, aspects of the disclosure, in particular aspects of CT residue generation systems configured to be calibrated using test signals as proposed herein, may be embodied in various manners—e.g. as a method, a system, a computer program product, or a computer-readable storage medium. Accordingly, aspects of the disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g., to the existing ADCs and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the select examples.

In the following description, reference is made to the drawings, where like reference numerals can indicate identical or functionally similar elements. It will be understood that elements illustrated in the drawings are not necessarily drawn to scale. Moreover, some embodiments can incorporate any suitable combination of features from two or more drawings. Further, it will be understood that certain embodiments can include more elements than illustrated in a drawing and/or a subset of the elements illustrated in a drawing. In general, while some drawings provided herein illustrate various aspects of CT residue generation systems configured to be calibrated using test signals, and systems in which such circuits may be implemented, details of these systems may be different in different embodiments. For example, various components of CT residue generation systems configured to be calibrated using test signals, presented herein, may have further components included therein, or coupled thereto, which are not specifically shown in the drawings, such as logic, storage, passive elements (e.g., resistors, capacitors, inductors, etc.), or other elements (e.g., transistors, etc.). In another example, details shown in some of the drawings, such as the particular arrangement and example implementation details of various components of CT residue generation systems configured to be calibrated using test signals presented herein (e.g., a residue generation circuit, etc.) and/or the particular arrangement of coupling connections (e.g., coupling connections between various components of CT residue generation systems configured to be calibrated using test signals as described herein, etc.) may be different in different embodiments, with the illustrations of the present drawings providing only some examples of how these components may be used together to realize CT residue generation systems configured to be calibrated using test signals. In yet another example, although some embodiments shown in the present drawings illustrate a certain number of components (e.g., a certain number of switches shown in FIG. 7), it is understood that these embodiments may be implemented in a CT residue generation systems configured to be calibrated using test signals or in any other devices or systems with any number of these components in accordance with the descriptions provided herein. Furthermore, although certain elements such as various elements of CT residue generation systems configured to be calibrated using test signals may be depicted in the drawings as communicatively coupled using a single depicted line, in some embodiments, any of these elements may be coupled by a plurality of conductive lines such as those that may be present in a bus, or when differential signals are involved.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect electrical connection through one or more passive or active intermediary devices/components. In another example, the terms "circuit" or "circuitry" (which may be used interchangeably) refer to one or more passive and/or active components that are arranged to cooperate with one another to provide a desired function. Sometimes, in the present descriptions, the term "circuit" may be omitted (e.g., an ADC circuit may be referred to simply as an "ADC," etc.). If used, the terms "substantially," "approximately," "about," "around," etc., may be used to generally refer to being within +/−20% of a target value, e.g., within +/−10% of a target value, based on the context of a particular value as described herein or as known in the art.

While embodiments of the disclosure were described above with references to exemplary implementations as shown in the figures, a person skilled in the art will realize that the various teachings described above are applicable to a large variety of other implementations.

In the discussions of the embodiments above, components of a system, such as e.g. combiners/adders, resistors, capacitors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the disclosure related to implementing one or more CT residue generation systems configured to be calibrated using test signals.

Parts of various CT residue generation systems configured to be calibrated using test signals as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In some embodiments, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the disclosure may be readily included in a system on chip (SOC) package, either in part, or in whole. An SOC represents an integrated circuit (IC) that integrates components of a computer or other electronic system into a single chip. It may contain digital, analog, mixed-signal, and often radio-frequency (RF) functions: all of which may be provided on a single chip substrate. Other embodiments may include a multi-chip-module (MCM), with a plurality of separate ICs located within a single electronic package and configured to interact closely with each other through the electronic package.

All of the specifications, dimensions, and relationships outlined herein (e.g., the number of components of the CT residue generation systems configured to be calibrated using test signals, or portions thereof, shown in the present drawings, etc.) have only been offered for purposes of example and teaching only. Such information may be varied considerably without departing from the spirit of the disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present drawings may be combined in various possible configurations, all of which are clearly within the broad scope of the disclosure. In certain cases, it may be easier to describe one or more of the functionalities of a given set of flows by only referencing a limited number of electrical elements. It should be appreciated that the electrical circuits of the present figures and its teachings are readily scalable and can accommodate a large number of components, as well as more complicated or sophisticated arrangements and configurations. Accordingly, the examples provided should not limit the scope or inhibit the broad teachings of the electrical circuits as potentially applied to a myriad of other architectures.

Furthermore, functions related to calibration of CT residue generation systems using test signals as proposed herein illustrate only some of the possible functions that may be executed by, or within, system illustrated in the present figures. Some of these operations may be deleted or removed where appropriate, or these operations may be modified or changed considerably without departing from the scope of the disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the disclosure.

Note that all optional features of the apparatus described above may also be implemented with respect to the method or process described herein and specifics in the examples may be used anywhere in one or more embodiments.

Numerous other changes, substitutions, variations, alterations, and modifications may be ascertained to one skilled in the art and it is intended that the disclosure encompass all such changes, substitutions, variations, alterations, and modifications as falling within the scope of the appended claims.

What is claimed is:

1. A continuous-time residue generation system, comprising:
    a forward path, comprising a continuous-time filter;
    a feedforward path in parallel with the forward path, comprising an analog-to-digital converter followed by a digital-to-analog converter;
    a further digital-to-analog converter couplable to a common input node of the forward path and the feedforward path to inject a test signal;
    a filter to receive a difference between outputs of the forward path and the feedforward path;
    a further analog-to-digital converter to receive the filtered difference, wherein the further digital-to-analog converter includes parallel elements, each parallel element comprising a resistance; and
    a calibration circuit to receive a digital output of the further analog-to-digital converter;
    wherein at least one of the forward path and the feedforward path have at least one circuit that is responsive to the calibration circuit.

2. The continuous-time residue generation system of claim 1, further comprising:
    a programmable input signal driver controllable have a high output impedance when the test signal is injected to the common input node of the forward path and the feedforward path.

3. The continuous-time residue generation system of claim 1, wherein the analog-to-digital converter in the feedforward path is to further receive a dither signal while the test signal is applied to the common input node of the forward path and the feedforward path.

4. The continuous-time residue generation system of claim 1, wherein the continuous-time filter in the forward path comprises an arrangement of shunt capacitive elements to provide a specific capacitor value based on an output of the calibration circuit.

5. The continuous-time residue generation system of claim 1, wherein the continuous-time filter in the forward path comprises an arrangement of cross-coupled capacitive elements to provide a specific capacitor value based on an output of the calibration circuit.

6. The continuous-time residue generation system of claim 1, wherein the digital-to-analog converter in the feedforward path comprises a circuit to trim a full-scale current of the digital-to-analog converter based on an output of the calibration circuit.

7. The continuous-time residue generation system of claim 1, wherein the further digital-to-analog converter comprises a test voltage source to generate the test signal and switching arrangement to apply the test signal or the test signal of opposite polarity.

8. The continuous-time residue generation system of claim 1, wherein the further digital-to-analog converter forms a half-bridge circuit with the continuous-time filter to inject the test signal.

9. The continuous-time residue generation system of claim 1, wherein the parallel elements of the further digital to analog converter include (1) a selection switch to couple the parallel element to the common input node of the forward path and the feedforward path, and (2) a control switch to couple the resistance to one of two voltage supplies.

10. A method to reduce mismatch of transfer functions of a forward path and a feedforward path of a continuous-time residue generation circuit, comprising:
    applying a test signal to a common input node of the forward path and the feedforward path;
    filtering a difference between outputs of the forward path and the feedforward path;
    digitizing the filtered difference to generate a digital output;
    measuring the mismatch of the transfer functions based on the digital output, which is generated as a result of the test signal being applied at the common input node, wherein measuring the mismatch of the transfer functions includes: computing a first average value of a sequence of a predetermined length of the digital output, and computing a second average value of a sequence of a predetermined length of a further digital output, and computing a difference of the first average value and the second average value; and
    adjusting one or more circuits in one or more of: the forward path and the feedforward path, to reduce the measured mismatch.

11. The method of claim 10, wherein applying the test signal comprises:
    applying a test value as the test signal.

12. The method of claim 11, wherein the test value to be applied as the test signal is optimally selected from a plurality of possible test values.

13. The method of claim 10, wherein measuring the mismatch of the transfer functions comprises:

computing an average value of a sequence of a predetermined length of the digital output.

14. The method of claim 11, further comprising:
applying a further test value as a further test signal to the common input node of the forward path and the feedforward path;
wherein measuring the mismatch of the transfer functions is further based on a further digital output generated as a result of the further test signal being applied at the common input node.

15. The method of claim 14, wherein the test value to be applied as the test signal and the further test value to be applied as the further test signal are optimally selected from a plurality of pairs of test values that sum to zero.

16. The method of claim 11, further comprising:
applying further test values as further test signals to the common input node of the forward path and the feedforward path;
wherein measuring the mismatch of the transfer functions is further based on further digital outputs generated as a result of the further test signals being applied at the common input node.

17. The method of claim 10, further comprising:
linearizing the feedforward path while the test signal is applied.

18. A continuous-time pipelined analog-to-digital converter, comprising:
a continuous-time residue generation circuit having a forward path, a feedforward path, and a node to combine outputs from the forward path and the feedforward path, wherein the forward path and the feedforward path process a same input of the continuous-time residue generation circuit;
test signal injection circuit to apply a test signal to the input of the continuous-time residue generation circuit;
a quantizer to quantize a combined output of outputs from the forward path and the feedforward path wherein the quantizer includes parallel elements, each parallel element comprising a resistance; and
a calibration circuit to observe a digital output of the quantizer generated as a result of the test signal being applied and to cause change in the forward path and/or the feedforward path in response to observing the digital output;
wherein the digital output indicates whether the forward path and the feedforward path are mismatched.

19. The continuous-time pipelined analog-to-digital converter of claim 18, further comprising:
a further continuous-time residue generating circuit having a further forward path, a further feedforward path, and a further node to combine outputs from the further forward path and further feedforward path, wherein the further continuous-time residue generating circuit generates the input to the continuous-time residue generating circuit.

20. The continuous-time pipelined analog-to-digital converter of claim 19, further comprising: circuitry to decouple an output signal of the further continuous-time residue generation circuit from an input node of the continuous-time residue generating circuit.

* * * * *